US009403620B2

(12) United States Patent  
Yamagata et al.

(10) Patent No.: US 9,403,620 B2  
(45) Date of Patent: *Aug. 2, 2016

(54) SILICA CONTAINER AND METHOD FOR PRODUCING THE SAME

(71) Applicant: SHIN-ETSU QUARTZ PRODUCTS CO., LTD., Tokyo (JP)

(72) Inventors: Shigeru Yamagata, Narashino (JP); Tomomi Usui, New Delhi (IN)

(73) Assignee: SHIN-ETSU QUARTZ PRODUCTS CO., LTD., Tokyo (JP)

( * ) Notice: Subject to any disclaimer, the term of this patent is extended or adjusted under 35 U.S.C. 154(b) by 586 days.

This patent is subject to a terminal disclaimer.

(21) Appl. No.: 13/861,700

(22) Filed: Apr. 12, 2013

(65) Prior Publication Data

US 2013/0248408 A1  Sep. 26, 2013

Related U.S. Application Data

(62) Division of application No. 13/145,063, filed as application No. PCT/JP2010/006179 on Oct. 19, 2010.

(30) Foreign Application Priority Data

Dec. 10, 2009 (JP) .................................. 2009-280417

(51) Int. Cl.  
*B65D 13/02* (2006.01)  
*C03B 19/09* (2006.01)  
(Continued)

(52) U.S. Cl.  
CPC .............. *B65D 13/02* (2013.01); *C03B 19/095* (2013.01); *C30B 15/10* (2013.01); *C30B 29/06* (2013.01); *C30B 35/002* (2013.01); *Y02P 40/57* (2015.11)

(58) Field of Classification Search  
CPC .... Y10T 117/10; B65D 13/02; C03B 19/095; C30B 15/10; C30B 29/06; C30B 35/002  
See application file for complete search history.

(56) References Cited

U.S. PATENT DOCUMENTS 2,038,627 A  4/1936 Badger  
4,935,046 A  6/1990 Uchikawa et al.  
(Continued)

FOREIGN PATENT DOCUMENTS

CN  1341080 A  3/2002  
JP  A-08-002932  1/1996  
(Continued)

OTHER PUBLICATIONS

Apr. 12, 2013 Office Action issued in U.S. Appl. No. 13/145,063.  
(Continued)

*Primary Examiner* — Robert M Kunemund  
*Assistant Examiner* — Hua Qi  
(74) *Attorney, Agent, or Firm* — Oliff PLC

(57) ABSTRACT

A silica container contains a substrate having a rotational symmetry, containing mainly a silica, and gaseous bubbles in a peripheral part of the substrate; a transparent silica glass in an inner peripheral part of the substrate; and an inner layer, formed on an inner surface of the substrate and containing a transparent silica glass; wherein the substrate contains Li, Na, and K in a total concentration of 50 or less ppm by weight; the substrate has a linear light transmittance of 91.8% to 93.2% at a light wavelength of 600 nm; the inner layer contains Li, Na, and K in a total concentration of 100 or less ppb by weight and at least one of Ca, Sr, and Ba in a total concentration of 50 to 2000 ppm by weight; and the inner layer has a linear light transmittance of 91.8% to 93.2% at a light wavelength of 600 nm.

4 Claims, 8 Drawing Sheets

(51) Int. Cl.
    *C30B 15/10*      (2006.01)
    *C30B 29/06*      (2006.01)
    *C30B 35/00*      (2006.01)

(56) References Cited

U.S. PATENT DOCUMENTS

| | | | |
|---|---|---|---|
| 6,131,409 A * | 10/2000 | Katsuro | C01B 33/18 |
| | | | 556/466 |
| 6,652,934 B1 | 11/2003 | Miyao et al. | |
| 6,660,671 B2 | 12/2003 | Werdecker et al. | |
| 6,672,107 B2 | 1/2004 | Werdecker et al. | |
| 7,118,789 B2 | 10/2006 | Kemmochi et al. | |
| 7,587,912 B2 | 9/2009 | Ohama et al. | |
| 2002/0166341 A1 | 11/2002 | Shelly et al. | |
| 2002/0192409 A1 | 12/2002 | Ohama et al. | |
| 2003/0012899 A1 | 1/2003 | Kemmochi et al. | |
| 2003/0041623 A1 * | 3/2003 | Werdecker | C03B 19/09 |
| | | | 65/17.6 |
| 2003/0124044 A1 * | 7/2003 | Fukui | C03B 19/1065 |
| | | | 423/335 |
| 2007/0051297 A1 * | 3/2007 | Kemmochi | C03B 19/095 |
| | | | 117/13 |

FOREIGN PATENT DOCUMENTS

| | | |
|---|---|---|
| JP | A-08-268727 | 10/1996 |
| JP | A-09-020586 | 1/1997 |
| JP | A-2000-159593 | 6/2000 |
| JP | A-2000-344536 | 12/2000 |
| JP | A-2002-362932 | 12/2002 |
| JP | A-2004-002082 | 1/2004 |
| JP | A-2004-131380 | 4/2004 |
| JP | A-2005-145731 | 6/2005 |
| JP | A-2007-091532 | 4/2007 |
| JP | A-2007-326780 | 12/2007 |
| JP | A-2008-081398 | 4/2008 |

OTHER PUBLICATIONS

Jun. 13, 2013 Taiwanese Search Report issued in Taiwanese Application No. 099136790 with English-language translation.
Aug. 15, 2014 Office Action issued in U.S. Appl. No. 13/145,063.
Sep. 6, 2013 Office Action issued in U.S. Appl. No. 13/145,063.
Jan. 14, 2015 Office Action issued in U.S. Appl. No. 13/145,063.
Aug. 26, 2013 Chinese Office Action issued in Chinese Application No. 201080006326.5 with partial English-language translation.
International Search Report issued in International Patent Application No. PCT/JP2010/006179 dated Nov. 22, 2010.
Jan. 25, 2013 Office Action issued in U.S. Appl. No. 13/145,063.

* cited by examiner

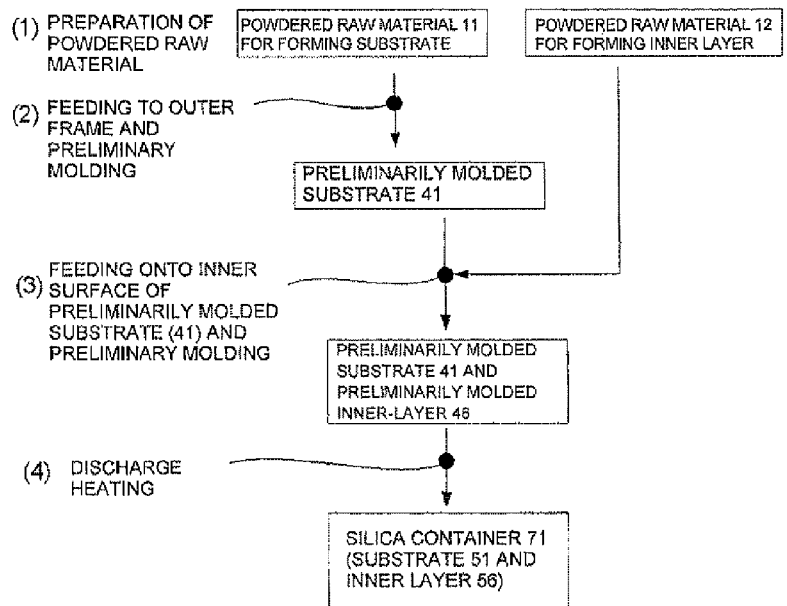
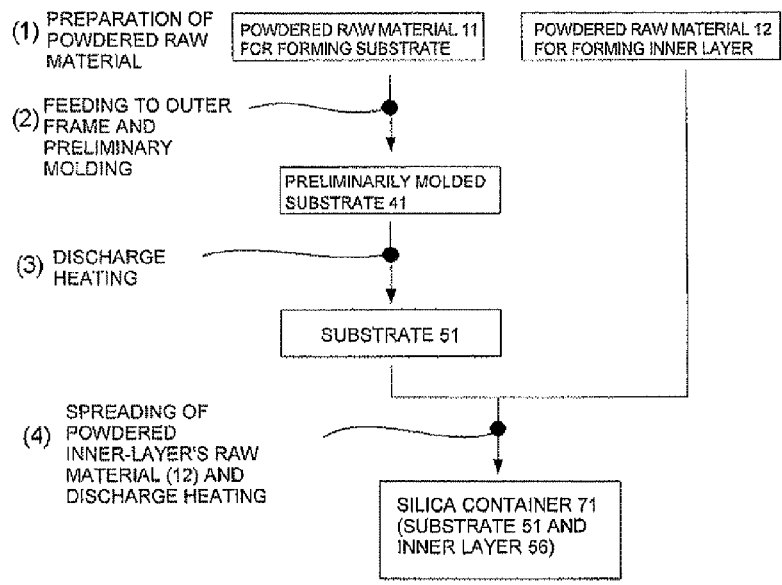
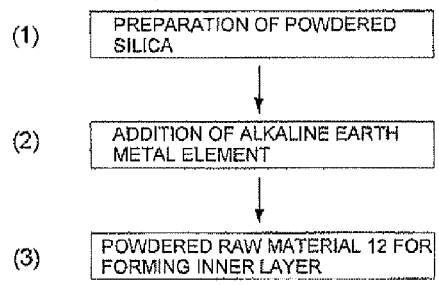

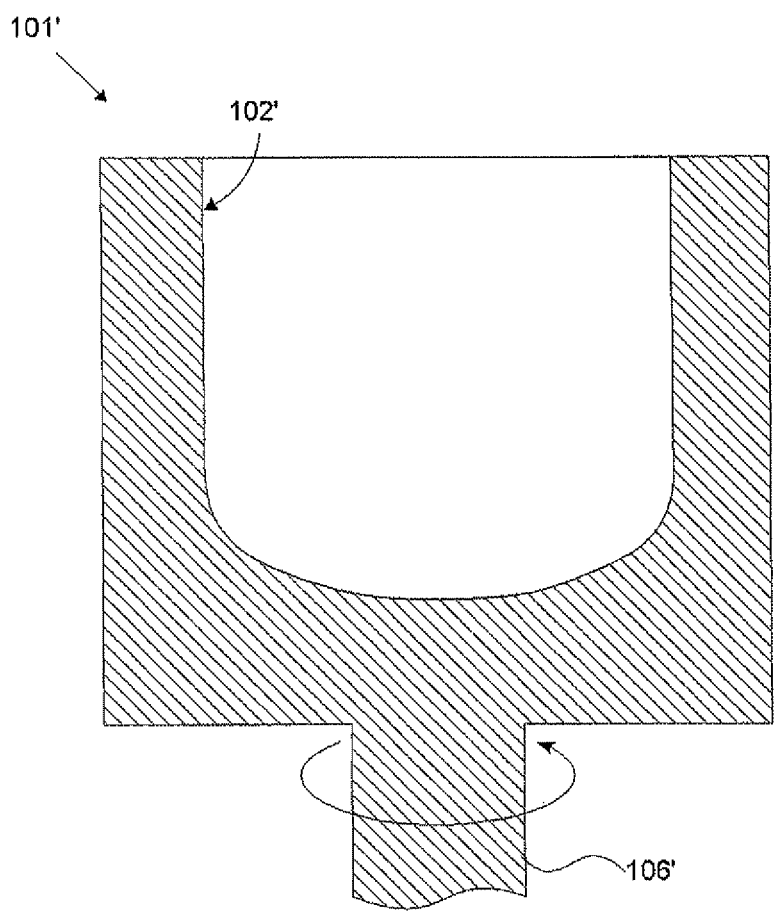

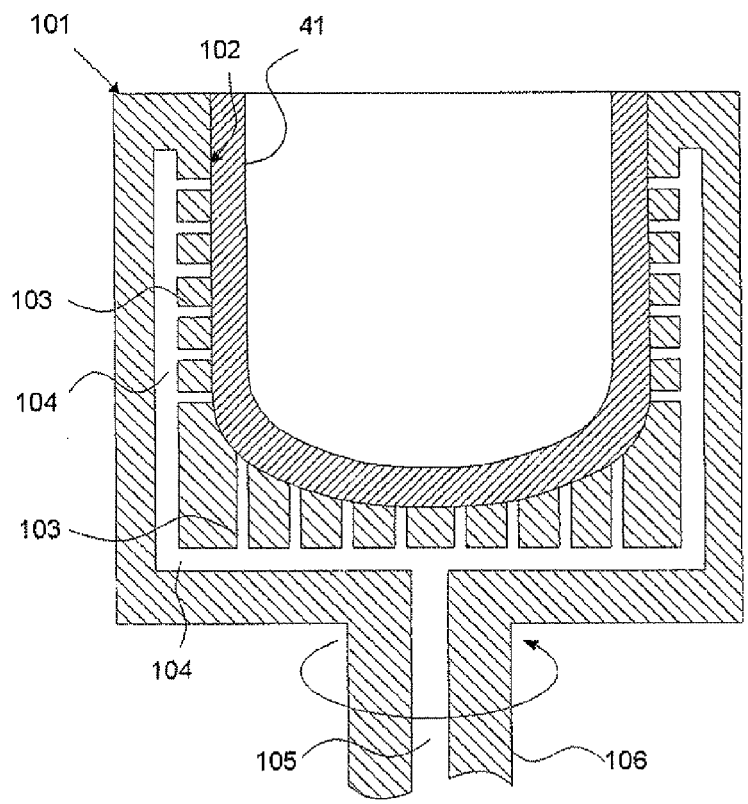
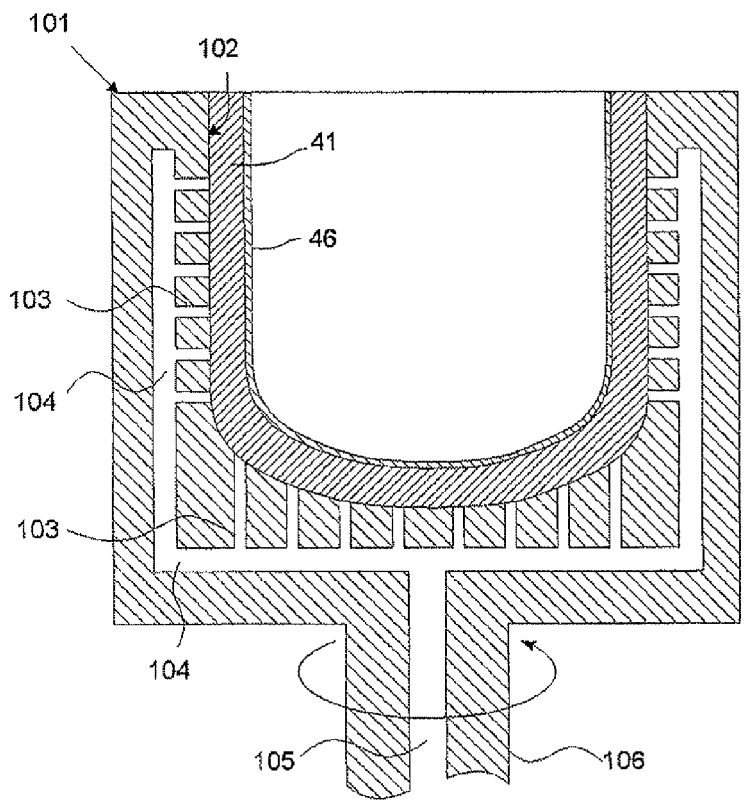

SILICA CONTAINER AND METHOD FOR PRODUCING THE SAME

This is a Division of application Ser. No. 13/145,063 filed Jul. 18, 2011, which in turn is a National Phase of Application No. PCT/JP2010/006179. The disclosure of the prior applications is hereby incorporated by reference herein in its entirety.

TECHNICAL FIELD

The present invention relates to a silica container comprised of mainly silica and to a method for producing it, in particular, to a silica container of a low cost, a high dimensional precision, and a high heat resistance and to a method for producing it.

BACKGROUND ART

A silica glass is used for a lens, a prism and a photomask of a photolithography instrument in manufacturing of a large-scale integrated circuit (LSI), for a TFT substrate used for a display, for a tube of a lamp, for a window material, for a reflection plate, for a cleaning container in a semiconductor industry, for a container for melting of a silicon semiconductor, and so forth. However, an expensive compound such as silicon tetrachloride must be used as a raw material for these silica glasses; on top of that, melting temperature and processing temperature of a silica glass is extraordinary high, as high as about 2000° C., thereby leading to a high energy consumption and a high cost. Accordingly, from the past, a method for producing a silica glass by using a relatively inexpensive, powdered raw material has been considered.

For example, in Patent Document 1, a method (slip casting method), wherein at least two different kinds of silica glass particles, for example, silica glass fine particles and silica glass granules are mixed to obtain a water-containing suspension solution, which is then press molded and sintered at high temperature to obtain a silica-containing composite body, is disclosed. In Patent Document 2, a method, wherein a mixed solution (slurry) containing silica glass particles having the size of 100 μm or less and silica glass granules having the size of 100 μm or more is prepared, then the slurry is cast into a molding frame, dried, and then sintered to obtain an opaque silica glass composite material, is disclosed. In these conventional slip casting methods, however, shrinkage of a molded article in a drying process and a sintering process is so significant that a thick silica glass article with a high dimensional precision could not be obtained.

Accordingly, there are problems in each method for producing a silica glass article as mentioned above. Therefore, as a method for producing a silica crucible for manufacturing of a single crystal silicon used for LSI (for a device), such production methods as those disclosed in Patent Document 3 and Patent Document 4 are being used still today. In these methods, after a powdered, ultra-highly purified natural quartz or a powdered synthetic cristobalite is fed into a rotating frame and then molded, carbon electrodes are inserted from the top and then electrically charged, thereby causing arc discharge to raise the atmospheric temperature to a temperature range for melting of the powdered quartz (temperature is estimated in the range from about 1800 to about 2100° C.) so that the powdered raw quartz may be melted and sintered.

In the methods such as those mentioned above, however, there has been a problem of a high cost because a powdered raw material quartz with high purity is used. In addition, because various kinds of impure gases are dissolved in a produced silica crucible, the gases are released and then incorporated into a silicon single crystal as gaseous bubbles thereby causing such problems as defects called a void and a pinhole when it is used as a silica crucible for growing of a silicon single crystal; and thus this has been causing problems in production cost as well as quality of the silicon crystal. In addition, there has been a big problem in durability of the silica crucible because of low etching resistance to a silicon melt at the time of pulling up of a single crystal silicon.

A method to improve the etching resistance to a silicon melt in a silica crucible for pulling up of a single crystal is shown in Patent Document 5. In Patent Document 5, an effect of applying a crystallization accelerator on an inner surface of a silica glass crucible is shown. As the crystallization accelerator, Mg, Sr, Ca, and Ba, which are alkaline earth metal elements belonging to the 2a group, and Al, which is the element belonging to the 3b group, are shown. However, a silica glass crucible as shown in Patent Document 5 was not the one having a transparent silica glass layer completely free from gaseous bubbles in an inner surface part of the crucible, but the one containing micro gaseous bubbles and inhomogeneously undissolved particles of various doped elements. Accordingly, there have been problems frequently that a pulled-up silicon single crystal contains silica fine particles as foreign substances and has defects such as a void and a pinhole. In addition, there appeared a problem of deformation of a crucible inner surface caused by large expansion of micro gaseous bubbles present inside the crucible during pulling up of a silicon single crystal.

A method to reduce gaseous bubbles in a silica glass in an inner surface of a silica crucible used for pulling up of a single crystal so that bubble expansion of the silica crucible in use may be suppressed is described in Patent Document 6. In Patent Document 6, it is disclosed that a silica crucible inner surface having few gaseous bubbles can be obtained if a powdered raw material for the silica crucible is made to contain hydrogen molecules with the concentration of $5 \times 10^{17}$ to $3 \times 10^{19}$ molecules/g. However, with this method, although amount of gaseous bubbles in the silica crucible inner surface could be reduced, an etching resistance to a silicon melt could not be improved by crystallizing the silica crucible inner surface to cristobalite. In addition, there has been a problem of a poor storage property of a hydrogen-containing powdered raw material because hydrogen molecules doped in the powdered raw material are gradually released to outside during storage of the powdered raw material.

A method for reducing growth of gaseous bubbles during the time that a silica crucible for silicon pulling up is in use is described in Patent Document 7. In this document, a method is disclosed wherein inside of a molded container is made an atmosphere of a helium gas or a hydrogen gas while degassing from its outside by aspiration during arc discharge melting by carbon electrodes in manufacturing of a crucible. With this method, however, even though amount of gaseous bubbles in the silica glass inner surface layer could be reduced, the OH group concentration in the silica crucible could not be reduced to a certain controlled level, nor was possible to improve durability and heat resistance of the silica crucible by finely crystallizing the inner surface to cristobalite during the time of using the crucible.

In Patent Document 8, a method for reducing amount of gaseous bubbles contained in a silica crucible used for pulling up of a silicon crystal is disclosed. In the Document, it is disclosed that any of a hydrogen gas and a helium gas or both is supplied to a powder article of the container during heating at the time of crucible production.

In Patent Document 9, it is disclosed that, during heating at the time of crucible production, an arc melting is started and continued after a helium gas or an argon gas is supplied to a powder article of the container; and before termination of the arc melting, supply of a helium gas or an argon gas is stopped or the amount thereof is reduced, while supply of a hydrogen gas is started.

In these methods, however, in similar to the foregoing, even though gaseous bubbles inside the silica crucible could be reduced, durability and heat resistance of the crucible could not be improved by protecting the inner surface by finely crystallizing the inner surface to cristobalite during the time of using the silica crucible.

CITATION LIST

Patent Document

Patent Document 1: Japanese Patent Application Laid-Open Publication No. 2002-362932
Patent Document 2: Japanese Patent Application Laid-Open Publication No. 2004-131380
Patent Document 3: Japanese Examined Patent Publication No. H04-22861
Patent Document 4: Japanese Examined Patent Publication No. H07-29871
Patent Document 5: Japanese Patent Application Laid-Open Publication No. H08-2932
Patent Document 6: Japanese Patent Application Laid-Open Publication No. 2007-326780
Patent Document 7: Japanese Patent Application Laid-Open Publication No. H08-268727
Patent Document 8: Japanese Patent Application Laid-Open Publication No. H09-20586
Patent Document 9: Japanese Patent Application Laid-Open Publication No. 2000-344536

SUMMARY OF THE INVENTION

Technical Problem to be Solved by the Invention

The present invention was made in view of the problems as mentioned above, and has an object to provide; a method for producing a silica container, comprised of mainly a silica, having a high dimensional precision and heat resistance, and producible with a low cost; and the silica container of this sort.

Solution to Problem

The present invention was made to solve the problems as mentioned above and provides a method for producing a silica container arranged with a substrate, having a rotational symmetry, comprised of mainly a silica, and containing gaseous bubbles at least in its peripheral part, and an inner layer, formed on an inner surface of the substrate and comprised of a transparent silica glass; wherein the process comprises at least:
　a step of preparing a powdered silica having particle diameter of 10 to 1000 μm and containing Li, Na, and K with the total concentration of 50 or less ppm by weight as a powdered raw material for forming the substrate,
　a step of preparing a powdered silica having particle diameter of 10 to 1000 μm and containing at least one of Ca, Sr, and Ba with the total concentration of 50 to 2000 ppm by weight as a powdered raw material for forming the inner layer,
　a step of forming a preliminarily molded substrate, wherein the powdered raw material for forming the substrate is fed into a frame and then preliminarily molded to an intended shape with rotating the frame,
　a step of forming a preliminarily molded inner layer, wherein the powdered raw material for forming the inner layer is fed onto an inner surface of the preliminarily molded substrate and then preliminarily molded to an intended shape in accordance with an inner surface of the preliminarily molded substrate, and
　a step of forming the substrate and the inner layer, wherein the preliminarily molded substrate and the preliminarily molded inner layer are heated from inside of the preliminarily molded substrate and inner layer by a discharge-heat melting method under a gas atmosphere containing a hydrogen gas or a helium gas or a gas mixture thereof with the ratio of more than 10% by volume thereby making an outer peripheral part of the preliminarily molded substrate to a sintered body while an inner peripheral part of the preliminarily molded substrate and the preliminarily molded inner layer to a fused glass body.

According to the method for producing a powdered silica as mentioned above, a high inhibiting effect of impurity diffusion, a high durability, and the like during the time that the silica container thus produced is used at high temperature can be obtained; and in addition, generation of gaseous bubbles in an inner wall of the silica container can be effectively suppressed.

The present invention further provides a method for producing a silica container arranged with a substrate, having a rotational symmetry, comprised of mainly a silica, and containing gaseous bubbles at least in its peripheral part, and an inner layer, formed on an inner surface of the substrate and comprised of a transparent silica glass; wherein the process comprises at least:
　a step of preparing a powdered silica having particle diameter of 10 to 1000 μm and containing Li, Na, and K with the total concentration of 50 or less ppm by weight as a powdered raw material for forming the substrate,
　a step of preparing a powdered silica having particle diameter of 10 to 1000 μm and containing at least one of Ca, Sr, and Ba with the total concentration of 50 to 2000 ppm by weight as a powdered raw material for forming the inner layer,
　a step of forming a preliminarily molded substrate, wherein the powdered raw material for forming the substrate is fed into a frame and then preliminarily molded to an intended shape with rotating the frame,
　a step of forming the substrate, wherein the preliminarily molded substrate is heated from inside of the preliminarily molded substrate by a discharge-heat melting method thereby making an outer peripheral part of the preliminarily molded substrate to a sintered body while an inner peripheral part of the preliminarily molded substrate to a fused glass body, and
　a step of forming the inner layer on an inner surface of the substrate, wherein the powdered raw material for forming the inner layer is spread from inside of the substrate with heating at high temperature from its inside by a discharge-heat melting method under a gas atmosphere containing a hydrogen gas or a helium gas or a gas mixture thereof with the ratio of more than 10% by volume.

Even according to the method for producing a powdered silica as mentioned above, a high inhibiting effect of impurity diffusion, a high durability, and the like during the time that the silica container thus produced is used at high temperature can be obtained; and in addition, generation of gaseous bubbles in an inner wall of the silica container can be effectively suppressed.

According to the method for producing a silica container by the present invention, at least one of the discharge-heat melting steps may be conducted with aspirating from outside of the substrate or the preliminarily molded substrate through the frame.

Accordingly, in the method for producing a silica container by the present invention, at least one of the discharge-heat melting steps can be conducted with aspirating from outside of the substrate or the preliminarily molded substrate through the frame so that a dissolved gas in the thus produced silica container may be reduced further effectively.

In addition, it is preferable that the powdered raw material for forming the inner layer be made to contain Ba with the concentration of 100 to 1000 ppm by weight and Al with the concentration of 10 to 100 ppm by weight.

When the powdered raw material for forming the inner layer is made to contain Ba with the concentration of 100 to 1000 ppm by weight and Al with the concentration of 10 to 100 ppm by weight, the inner layer can be made to a silica glass layer having further high light transmittance and containing extremely low amount of gaseous bubbles.

In addition, it is preferable that a dew-point temperature of the gas atmosphere containing a hydrogen gas or a helium gas or a gas mixture thereof be set between 15° C. and −15° C. and controlled within ±2° C. of the set dew-point temperature.

Accordingly, when the dew-point temperature of the gas atmosphere is set and controlled as mentioned above, amount of OH group and amount of water ($H_2O$) contained in the silica container can be reduced to intended values in spite of low cost.

In addition, it is preferable that, in the gas atmosphere containing a hydrogen gas or a helium gas or a gas mixture thereof, the ratio of a hydrogen gas or a helium gas or a gas mixture thereof be made to 100% by volume.

Accordingly, in the gas atmosphere containing a hydrogen gas or a helium gas or a gas mixture thereof, when the ratio of a hydrogen gas or a helium gas or a gas mixture thereof is made to 100% by volume, generation of gaseous bubbles in an inner wall of the silica container can be suppressed further effectively.

In addition, the present invention provides a silica container, a silica container arranged with a substrate, having a rotational symmetry, comprised of mainly a silica, containing gaseous bubbles in its peripheral part, and having a transparent silica glass in its inner peripheral part, and an inner layer, formed on an inner surface of the substrate and comprised of a transparent silica glass; wherein the substrate contains Li, Na, and K with the total concentration of 50 or less ppm by weight and shows a linear light transmittance of 91.8 to 93.2% at a light wavelength of 600 nm for a sample having 10 mm thickness cut-out from the inner peripheral part and finished with both surfaces being parallel and optically polished, and the inner layer contains Li, Na, and K with the total concentration of 100 or less ppb by weight and at least one of Ca, Sr, and Ba with the total concentration of 50 to 2000 ppm by weight and shows a linear light transmittance of 91.8 to 93.2% at a light wavelength of 600 nm for a sample having 10 mm thickness cut-out from the inner layer and finished with both surfaces being parallel and optically polished, and amount of water molecules released from a sample cut-out from the inner layer upon heating under vacuum at 1000° C. is less than $2 \times 10^{17}$ molecules/g.

The silica container as mentioned above can be given in the container inner wall a high inhibiting effect of impurity diffusion, a high durability, and the like during its use at high temperature, in spite of a low cost silica container having adequate temperature uniformity; and in addition, generation of gaseous bubbles in the container inner wall can be effectively suppressed. As a result, a harmful effect to a material accommodated in the silica container due to gaseous bubbles generated in the container inner wall can be suppressed. Meanwhile, the light transmittance reflects amount of gaseous bubbles in a glass and uniform solubility of a doped element.

In this case, it is preferable that the inner layer be made to contain Ba with the concentration of 100 to 1000 ppm by weight and Al with the concentration of 10 to 100 ppm by weight.

When the inner layer is made to contain Ba with the concentration of 100 to 1000 ppm by weight and Al with the concentration of 10 to 100 ppm by weight, the inner layer can be made to a silica glass layer having further high light transmittance and containing extremely low amount of gaseous bubbles.

In addition, it is preferable that the inner layer be made to contain OH groups with the concentration of 1 to 50 ppm by weight, Li, Na, and K with each concentration of 20 or less ppb by weight, and Ti, Cr, Mn, Fe, Ni, Cu, Zn, Zr, Mo, and W with each concentration of 10 or less ppb by weight.

When the inner layer is made to contain OH groups and respective metals with the concentrations as mentioned above, impurity contamination to a material accommodated in the produced silica can be prevented further effectively.

Advantageous Effects of the Invention

According to the method for producing a silica container of the present invention, a high inhibiting effect of impurity diffusion, a high durability, and the like during the time that the produced silica container is used at high temperature can be obtained; and in addition, generation of gaseous bubbles in an inner wall of the silica container can be effectively suppressed.

In addition, the silica container according to the present invention can be given in the silica inner wall a high inhibiting effect of impurity diffusion, a high durability, and the like during its use at high temperature, in spite of a low cost silica container having adequate uniformity of temperature; and in addition, generation of gaseous bubbles in the silica inner wall can be effectively suppressed. As a result, a harmful effect to a material accommodated in the silica container due to gaseous bubbles generated in the silica container inner wall can be suppressed.

BRIEF DESCRIPTION OF DRAWINGS

FIG. 1 is a flow chart showing outline of one example of the method for producing a silica container according to the present invention.

FIG. 2 is a flow chart showing outline of another example of the method for producing a silica container of the present invention.

FIG. 3 is a flow chart showing outline of one example of the step of preparing a powdered raw material for forming the inner layer according to the present invention.

FIG. 6 is a schematic cross section view showing another example of the frame usable in the method of a silica container according to the present invention.

FIG. 7 is a schematic cross section view schematically showing one example of the step of forming the preliminarily molded substrate in the method for producing a silica container according to the present invention.

FIG. 8 is a schematic cross section view schematically showing one example of the step of forming the preliminarily molded inner layer on an inner surface of the preliminarily molded substrate in the method for producing a silica container according to the present invention.

DESCRIPTION OF EMBODIMENTS

Figure 4:
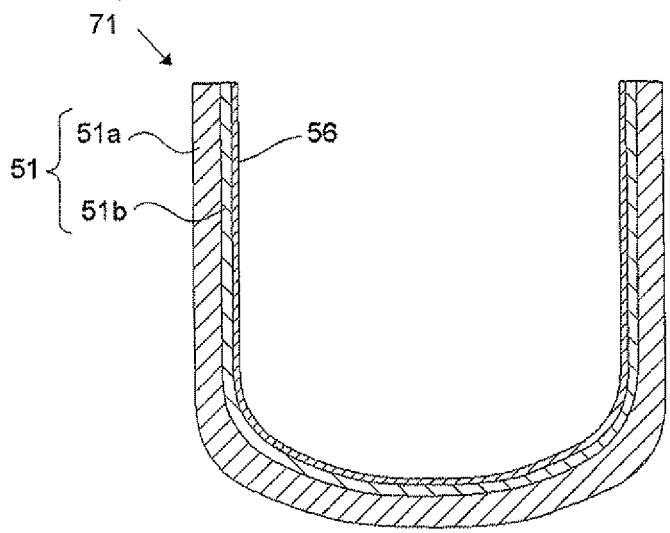
FIG. 4 is a schematic cross section view showing one example of the silica container according to the present invention.

As mentioned above, in a conventional method for producing a silica container, there have been problems in dimensional precision and cost.

In addition, a silica container produced by a conventional method for producing a silica container had a problem such as, a harmful effect of gaseous bubbles to a material accommodated therein, for example, incorporation of gaseous bubbles into a silicon single crystal in a silica crucible for growing of a silicon single crystal.

The inventors carried out investigation in view of the problems as mentioned above and found the following problems to be solved.

Firstly, a silica container such as a crucible and a boat for melting of a metal silicon and for production of a silicon single crystal or a polycrystalline silicon requires thermal uniformity inside the container under atmosphere of a high heating temperature. Because of this, the first problem to be solved is to make the silica container at least a two-layer structure, wherein an outside part of the container is made to a porous, white and opaque silica glass while an inside part of the container is made to a thick, colorless and transparent silica glass containing substantially no gaseous bubbles.

The second problem to be solved is to give a function to inhibit diffusion of an impure substance (impurity-shielding function). This is to suppress a harmful contamination effect to a material accommodated in a silica container due to an impure substance contained in the silica container.

For example, if an impure metal element contained in the silica container, for example, not only alkaline metal elements such as Li, Na, and K, but also Ti, Cr, Mn, Fe, Ni, Cu, Zn, Zr, Mo, W, and the like are incorporated into a silicon crystal during production of silicon crystals, it causes decrease in the incident photon-to-current conversion efficiency especially in a silicon device for solar use. Accordingly, in order to inhibit diffusion of an impure substance contained in the silica container into a silicon melt, inner surface of the silica container is made finely crystallized (made to a glass ceramics) so that a function to inhibit diffusion of an impure substance may be given. In addition, in view of quality of the finely crystallized part of the inner surface of the silica container having dimensionally fine and precise individual crystals, a crystallized layer is made of cristobalite and the like having fine texture.

The third problem is to give an etching resistance by finely crystallizing inner surface of the silica container with cristobalite and the like having fine texture.

For example, if a component ($SiO_2$) itself of the silica container is dissolved into a silicon melt during production of a silicon single crystal production thereby incorporating an oxygen element into the silicon crystal, there appears a problem such as, for example, to cause decrease in the incident photon-to-current conversion efficiency in a silicon device for solar use. Accordingly, in similar to the above, the inner surface of the container is made to have characteristics not to be dissolved easily into a silicon melt (i.e., having an etching resistance to a silicon melt), that is, to make the inner surface of the container finely crystallized by cristobalite and the like having fine texture.

In the case that at least one element of alkaline earth metal elements Ca, Sr, and Ba is doped non-uniformly as a crystallization accelerator in the inner surface layer of the silica container and the inner surface layer contains fine gaseous bubbles, a gas contained therein is released from the gaseous bubbles and eluted into a silicon melt during production of a silicon crystal, thereby causing structural defects called a pinhole and a void by incorporation of gas bubbles into the silicon crystal. Accordingly, the fourth problem is to give a thick glass layer not containing gaseous bubbles in the inner surface layer of the silica container while containing an alkaline earth metal element uniformly dissolved thereby making a completely colorless and transparent glass having a high light transmittance.

As mentioned above, in the present invention, it was necessary to simultaneously solve these four technical problems with a lower cost as compare with a silica container such as a crucible, produced by a conventional method using an expensive, high purity powdered silica raw material, for pulling up of a high purity single crystal silicon; accordingly, this is the fifth problem to be solved.

Hereinbelow, the present invention will be explained in detail with referring to the figures, but the present invention is not limited to them. In particular, in what follows, a silica container (a solar-grade crucible) applicable as a container for melting of a metal silicon used as a material for a solar cell (a solar photovoltaic power generation, or a solar power generation) as well as a production method thereof will be mainly explained as one suitable example of application of the present invention; but the present invention is not limited to this and can be applied widely to a general silica container comprised of mainly a silica and used at high temperature.

In FIG. 4, a schematic cross section view of one example of the silica container according to the present invention is shown.

The silica container 71 according to the present invention has a rotational symmetry, and its basic structure is comprised of the substrate 51 and the inner layer 56.

The substrate 51 has a rotational symmetry and is comprised of mainly a silica. The substrate 51 contains gaseous bubbles in the substrate's outer peripheral part 51a. Namely, the substrate's outer peripheral part has a porous, white and opaque layer part. The substrate's inner peripheral part 51b contains a transparent silica glass.

The inner layer 56 is formed on the inner surface of the substrate 51 and is comprised of a transparent silica glass.

In the present invention, in addition to the foregoing, the substrate 51 contains Li, Na, and K with the total concentration of 50 or less ppm by weight.

In addition, the inner layer 56 contains at least one of Ca, Sr, and Ba with the total concentration of 50 to 2000 ppm by weight and shows a linear light transmittance of preferably 91.8 to 93.2%, or more preferably 92.4 to 93.2%, at a light wavelength of 600 nm for a sample having 10 mm thickness with both surfaces being parallel and optically polished. Further, amount of water molecules released from a sample cut-out from the inner layer 56 is less than $2 \times 10^{17}$ molecules/g, or preferably less than $1 \times 10^{17}$ molecules/g upon heating at 1000° C. under vacuum.

In addition, in the silica container according to the present invention, a linear light transmittance of the substrate 51 is also 91.8 to 93.2% at a light wavelength of 600 nm for a sample having 10 mm thickness cut-out from the inner peripheral part 51b and finished with both surfaces being parallel and optically polished.

Meanwhile, as far as the container of the present invention has at least the substrate 51 and the inner layer 56, the silica container may further contain a layer other than these layers.

The silica container 71 having a composition as mentioned above can have an adequate temperature uniformity with low cost. In other words, in the silica container, when at least the substrate's outer peripheral part 51a is made to a porous non-transparent silica body and at least the inner layer 56 is made to a thick transparent silica glass body not substantially containing gaseous bubbles, temperature uniformity inside the silica container 71 during the time that the silica container 71 is used at high temperature can be improved.

In addition, when the silica container 71 is used at high temperature between 1400 and 1600° C., if the inner layer 56 is made to contain at least one of Ca, Sr, and Ba, especially Ba as mentioned above, a surface part of the silica glass can be recrystallized by cristobalite and the like; and as a result, elution by diffusion of an alkaline metal element such as Na, K, and Li contained in the substrate 51 of the silica container 71 can be prevented, and in addition, etching of an inner surface of the silica container 71 by a material accommodated therein, such as a metal silicon melt, which is treated in the silica container 71, can be reduced. Ba is preferable, also because it is not easily incorporated into a produced silicon single crystal.

In addition, according to the present invention, generation of gaseous bubbles in the inner layer 56 and the inner peripheral part 51b of the substrate can be effectively suppressed. As a result, a harmful effect to a material accommodated in the silica container, due to generation of gaseous bubbles in an inner wall of the silica container 71, can be suppressed.

Meanwhile, if gaseous bubbles in the inner layer 56 is adequately suppressed and an alkaline earth metal element such as Ba is uniformly dissolved, a light transmittance at a light wavelength of 600 nm for the sample having 10 mm thickness cut out from the inner layer 56 and finished with both surfaces being parallel and optically polished becomes 91.8 to 93.2%, as mentioned above. If the gaseous bubbles are further reduced and the alkaline earth metal element is uniformly dissolved, the light transmittance becomes 92.4 to 93.2%. Among the values, the upper limit value 93.2% is theoretically the maximum value in the silica glass. In addition, the present invention can provide the silica container 71 showing 91.8 to 93.2% of a linear light transmittance also in the substrate 51 at a light wavelength of 600 nm for the sample having 10 mm thickness cut-out from the inner peripheral part 51b and finished with both surfaces being parallel and optically polished.

Meanwhile, a length of the sides other than one side having the length of 10 mm in the sample having 10 mm thickness cut-out from each layer and finished with both surfaces being parallel and optically polished is not particularly limited as far as the linear transmittance can be measured. For example, a linear transmittance can be measured for a 2-mm×2-mm×10-mm sample.

If the inner layer 56 is made to contain Al with the concentration of 10 to 100 ppm by weight, not only a further enhanced inhibition effect of impurity diffusion can be given but also the alkaline earth metal element such as Ba can be dissolved further uniformly. Accordingly, generation of gaseous bubbles in an inner wall of the silica container can be suppressed further effectively.

Details of a mechanism for Al to prevent migration and diffusion of an impure metal element in the silica glass from occurring is not known; but it is assumed that, because of difference in the coordination number by displacing a Si atom with an Al atom, a positive ion (cation) of an impure alkaline metal element such as $Li^+$, $Na^+$, and $K^+$ is adsorbed and its diffusion is inhibited in order to keep the electric charge balance within a silica glass network.

It is assumed that displacement of a Si atom with an Al atom has an effect to also immobilize a positive ion of an alkaline earth metal element such as $Ba^{2+}$ in order to keep the electric charge balance so that the element such as Ba can be dissolved further uniformly; and because of this, gaseous bubbles in the silica glass can be suppressed as well.

An aim for the inner layer 56 not to make contain fine gaseous bubbles may be accomplished by a procedure that a powdered raw material for forming the inner layer 56 (powdered silica) is made to contain in advance an element such as Ca, Sr, and Ba to accelerate crystallization, and the atmospheric gas is made to contain, just before the melting treatment of the powdered raw material, a hydrogen gas, or a helium gas, or a gas mixture thereof with the ratio of more than 10% by volume (hereinafter, this atmosphere is sometimes simply abbreviated as "hydrogen/helium-containing atmosphere").

When the powdered silica raw material incorporated in advance with the foregoing crystallization accelerator is heat-melted under the hydrogen/helium-containing atmosphere, a silica glass layer with substantially no gaseous bubbles and with the crystallization accelerator being dissolved uniformly can be produced. That the crystallization accelerator is uniformly dissolved (doped) and the silica glass layer contains substantially no gaseous bubbles means that, by a visual examination, there are no gaseous bubbles observed and the layer can be seen colorless and transparent; and specifically, it means that, as mentioned above, a linear transmittance at a light wavelength of 600 nm for a sample having 10 mm thickness and finished with both surfaces being parallel and optically polished is 91.8 to 93.2%, or preferably 92.4 to 93.2%.

Namely, to form a transparent silica glass by heat-melting of a powdered silica containing at least one element of Ca, Sr, and Ba with the total concentration of 50 to 2000 ppm by weight under the hydrogen/helium-containing atmosphere, or to form a transparent silica glass by heat-melting of a powdered silica containing preferably Ba with the concentration of 100 to 1000 ppm by weight and Al with the concentration of 10 to 100 ppm by weight under the hydrogen/helium-containing atmosphere has not been previously described in a literature, but was figured out and demonstrated for the first time by the inventors.

Under the conditions as mentioned above, although an inner layer with no gaseous bubbles can be obtained if total amount of alkaline earth metal elements of Ca, Sr, and Ba is less than 50 ppm by weight, recrystallization of the inner surface is difficult to take place during the time that the silica container is used at high temperature; while if the amount is more than 2000 ppm by weight, it is difficult to dissolve these alkaline earth metal elements into the inner layer uniformly and without forming gaseous bubbles because the concentration is too high. In addition, in the case that Ba is only one element contained therein among the alkaline metal elements, Ba can be dissolved uniformly and without forming gaseous bubbles if the Ba concentration is in the range between 100 and 1000 ppm by weight; and in addition, recrystallization of cristobalite can take place uniformly in the inner surface during the time that the silica container is used at high temperature, so that it is preferable. Especially, when Ba is contained with the concentration of 100 to 1000 ppm by weight and Al with the concentration of 10 to 100 ppm by weight, the foregoing effect can be improved. When a powdered silica raw material concurrently containing both Ba and Al with the amount as mentioned above is heat-melted under the hydrogen/helium-containing atmosphere, a silica glass layer having an extremely high light transmittance and containing no gaseous bubbles can be obtained.

Meanwhile, the mixing ratio of a hydrogen gas or a helium gas in the hydrogen/helium-containing atmosphere is made more than 10% by volume as mentioned above. When other gas is mixed, an inert gas such as a nitrogen gas and a rare gas is preferable; but a hydrogen gas and a helium gas with the total concentration of 100% by volume is more preferable.

In the method for producing a silica container of the present invention, it is important that a crystallization accelerator such as Ba is doped with a uniform concentration and without incorporating gaseous bubbles into a silica glass after melting. Detailed mechanism is not clear, but it is assume that a hydrogen molecule ($H_2$) reacts with an oxygen molecule ($O_2$) having a large molecular diameter to form a water molecule ($H_2O$) having a relatively small molecular diameter, which can be diffused and released easily to outside a silica glass, so that generation of gaseous bubbles may be prevented. Amount of the water molecule contained therein must be made less than $2 \times 10^{17}$ molecules/g as the amount of steam released at 1000° C. under vacuum.

In addition, a hydrogen molecule itself has a small molecular diameter so that its diffusion rate in a silica glass is fast; and thus it does not cause formation of gaseous bubbles even if it remains in the silica glass.

Detailed mechanism of an effect of a helium gas on reduction of gaseous bubbles in a silica glass is not clear either; but it may be assumed that a molecular diameter of a helium molecule (namely, a helium atom) is further smaller than that of a hydrogen molecule so that diffusion and release of gases contained in a silica glass to outside thereof may be made easier thereby preventing generation of gaseous bubbles.

A helium molecule has a further smaller molecular diameter than a hydrogen molecule so that its diffusion rate in a silica glass is fast; and thus it does not cause formation of gaseous bubbles even if it remains in the silica glass.

In addition, to dissolve a crystallization accelerator such as Ba uniformly into a silica glass is important in order to form silica fine crystals abundantly and uniformly on surface part of the silica glass during the time that a silica container is used at high temperature. Although a detailed mechanism is not clear, in a silica glass treated with heat-melting under an atmosphere containing a hydrogen gas with the amount more than 10% by volume, a growth rate of a crystal such as cristobalite tends to be slower. Accordingly, if a silica container is prepared by using a powdered silica that is containing Ba and the like and treated with heat-melting under an atmosphere containing a hydrogen gas with the amount more than 10% by volume, a fine and tight recrystallized layer can be formed during the time that the silica container is used. As the reason for this, it is assumed that the silica glass that is treated with heat-melting under an atmosphere containing a hydrogen gas with the amount more than 10% by volume contains some sort of a defect related to an oxygen deficit so that this structural defect may slow down appropriately the growth rate of crystals such as cristobalite. Accordingly, in order to form a recrystallized layer having fine texture on an inner surface of the silica container, it is preferable that the powdered silica raw material be made to contain a crystallization accelerator such as Ba, and this powdered raw material be made to a melted glass under an atmosphere containing a hydrogen gas with the amount more than 10% by volume.

In addition, as mentioned above, the present invention can provide the silica container 71 having a linear transmittance of the substrate 51 being also 91.8 to 93.2% at a light wavelength of 600 nm for a sample having 10 mm thickness cut-out from the inner peripheral part 51b and finished with both surfaces being parallel and optically polished. As seen above, a colorless and transparent silica glass layer not substantially containing gaseous bubbles can be formed also in the inner peripheral part 51b of the substrate 51 so that the silica container can withstand a long-time use under conditions to increase in etching amount of the container inner wall thereby increase in etching amount of the inner layer 56 as well by the operation for many hours such as, for example, continuous pulling up (multipulling) of a silicon single crystal.

However, in order to secure thermal uniformity inside the container, it is necessary to leave a layer containing gaseous bubbles in the substrate's outer peripheral part 51a; and thus, it is preferable that the thickness of the colorless and transparent silica glass layer not substantially containing gaseous bubbles be about less than half of the thickness of the substrate 51 (about 5 mm in the case that the substrate 51 has thickness of 10 mm).

Meanwhile, it is preferable that the inner layer 56 of the silica container 71 contain OH groups with the amount of 1 to 50 ppm by weight, Li, Na, and K with each concentration of 20 or less ppb by weight, and Ti, V, Cr, Fe, Co, Ni, Cu, Zn, Zr, Mo, and W with each concentration of 10 or less by ppb. This is because, if the OH group concentration and concentration of each metal are those as shown above, an impurity contamination to a material accommodated in the silica container 71 can be reduced further effectively. However, when the amount of OH group exceeds 50 ppm by weight, heat resistance of the silica container is decreased; and thus it is not preferable.

Hereinbelow, the method for producing a silica container of the present invention that can produce the silica container 71 as mentioned above will be explained further specifically. In particular, a method for producing a silica container (solar-grade crucible) producible with a low production cost, usable as a container for melting of a metal silicon (Si) used as a material for a solar photovoltaic power generation device and the like as well as for pulling up of a single crystal, will be explained as the example.

A schematic diagram of one example of a method for producing the silica container 71 according to the present invention (first embodiment) is shown in FIG. 1.

Firstly, as shown in FIG. 1 (1), the powdered raw material 11 for forming the substrate and the powdered raw material 12 for forming the inner layer, each being a powdered silica, are prepared.

Among them, the powdered raw material 11 for forming the substrate is the one that will become a main composition material of the substrate 51 in the silica container 71 of the present invention (refer to FIG. 4).

This powdered raw material 11 for forming the substrate can be obtained, for example as described below, by crushing a mass of silica and then classifying the powders thereby obtained; though the method is not limited to it.

Firstly, a mass of natural silica (naturally produced berg crystal, quartz, silica, silica stone, opal stone, and so forth) having diameter of about 5 to about 50 mm is heated at 600 to 1000° C. for about 1 to about 10 hours under an air atmosphere. Then, the mass of natural silica thus treated is poured into water to be cooled down quickly, separated, and then dried. With these treatments, subsequent crushing by a crusher or the like and classification of the obtained powders can be carried out easily; but crushing treatment may be carried out without conducting the foregoing heating and quick cooling treatments.

Then, the mass of the natural silica is crushed by a crusher or the like, and then classified to particles having diameter of 10 to 1000 μm, or preferably 50 to 500 μm, to obtain a powdered natural silica.

Thereafter, the powdered natural silica thus obtained is heated at 700 to 1100° C. for about 1 to about 100 hours in a rotary kiln made of a silica glass tube having an inclination angle, inside of which is made to an atmosphere containing a hydrogen chloride gas (HCl) or a chlorine gas ($Cl_2$) for high-purification treatment. However, for the use not requiring a high purity, this high-purification treatment can be omitted to proceed to the subsequent steps.

The powdered raw material 11 for forming the substrate obtained after the foregoing steps is of a crystalline silica; but depending on the use purpose of the silica container, an amorphous silica glass scrap may also be used as the powdered raw material 11 for forming the substrate.

Diameter of the powdered raw material 11 for forming the substrate is preferably 10 to 1000 μm, or more preferably 50 to 500 μm, as mentioned above.

Silica purity of the powdered raw material 11 for forming the substrate is preferably 99.99% or higher by weight, or more preferably 99.999% or higher by weight. In particular, total concentration of Li, Na, and K is made 50 or less ppm by weight. Further, according to the method for producing a silica container of the present invention, even if silica purity of the powdered raw material 11 for forming the substrate is made relatively low, such as, 99.999% or lower by weight, in the silica container prepared therefrom, impurity contamination to a material accommodated therein can be adequately avoided. Accordingly, the silica container can be produced with a lower cost as compared with conventional methods.

Meanwhile, the powdered raw material 11 for forming the substrate may be made to further contain Al with the concentration of preferably 10 to 500 ppm by weight.

Al can be contained in the powdered silica by feeding the powdered silica into an aqueous or an alcohol solution of an Al salt such as a nitrate salt, an acetate salt, a carbonate salt, or a chloride for soaking, and then by drying.

On the other hand, the powdered raw material 12 for forming the inner layer is the one that will become a main composition material of the inner layer 56 in the silica container 71 of the present invention (refer to FIG. 4). As the powdered raw material 12 for forming the inner layer, a powdered silica having particle diameter of 10 to 1000 μm and containing at least one of Ca, Sr, and Ba with the total concentration of 50 to 2000 ppm by weight is prepared.

Outline of one example of a method for producing the powdered raw material 12 for forming the inner layer as mentioned above is shown in FIG. 3.

Firstly, as shown in FIG. 3 (1), a base material that is powders having particle diameter of 10 to 1000 μm and comprised of a silica is prepared.

An illustrative example of the powdered raw material for forming the inner layer for the silica container includes a powdered, highly purified natural quartz, a powdered natural berg crystal, a powdered synthetic cristobalite, and a powdered synthetic silica glass. To reduce gaseous bubbles in a transparent layer, a powdered crystalline silica is preferable; and to obtain a transparent layer of highly purity, synthetic powders are preferable. Particle diameter is preferably 100 to 500 μm. Purity is preferably 99.9999% or higher by weight as the silica component ($SiO_2$); and total concentration of the alkaline metal elements Li, Na, and K is 100 or less ppb by weight, wherein each concentration of the elements is preferably 20 or less ppb by weight, or more preferably 10 or less ppb by weight. Content of each of Ti, V, Cr, Fe, Co, Ni, Cu, Zn, Mo, and W is preferably 10 or less ppb by weight, or more preferably 5 or less ppb by weight.

Then, as shown in FIG. 3 (2), an alkaline earth metal element is added to the powdered silica as the base material.

Specifically, the powdered silica is made to contain at least one or more of calcium (Ca), strontium (Sr), and barium (Ba), or preferably Ba. The method for addition may be as follows: a chloride, an acetate salt, a nitrate salt, or a carbonate salt of an alkaline earth metal element to be dissolved into water or an alcohol is selected, and then an aqueous solution or an alcohol solution of the selected compound is prepared, and then the powdered silica raw material is soaked into the solution thus prepared; and then, after drying the resulting mixture, the powders added with a specific element can be obtained.

According to the procedure shown above, the powdered raw material 12 for forming the inner layer can be produced, as shown in FIG. 3 (3).

Then, as shown in FIG. 1 (2), the powdered raw material 11 for forming the substrate thus prepared is fed into a frame having a rotational symmetry for molding the powdered raw material 11 for forming the substrate.

Figure 5:
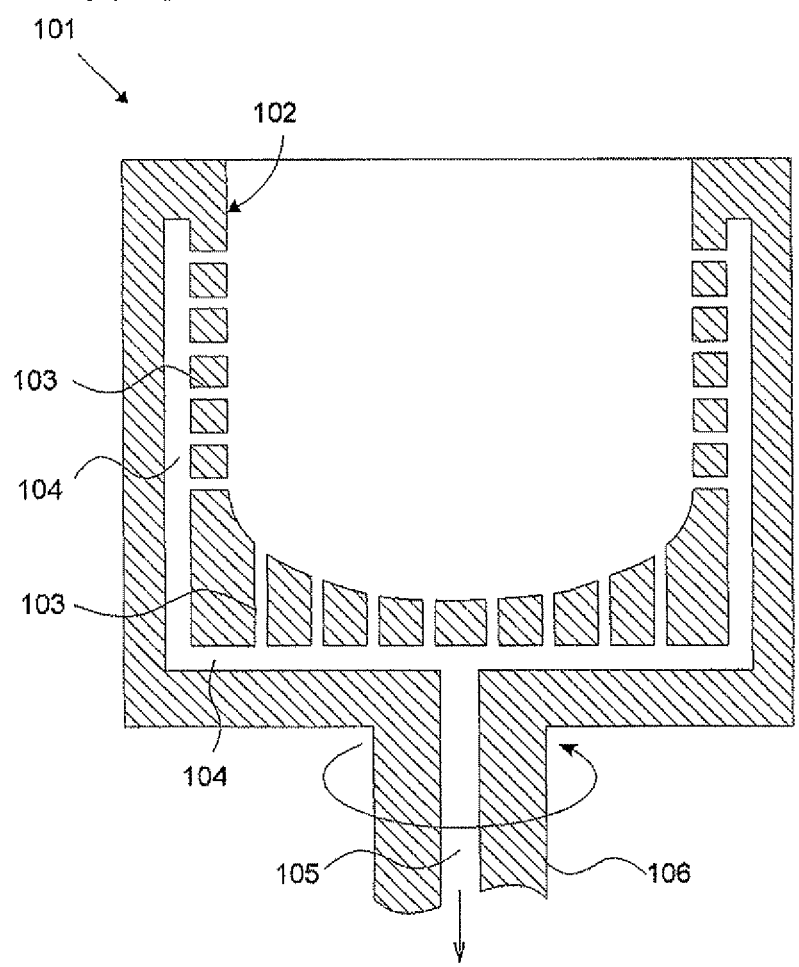
FIG. 5 is a schematic cross section view showing one example of the frame usable in the method of a silica container according to the present invention.

In FIG. 5, a cross section view showing an outline of an evacuable frame is illustrated, as one example of the frame to preliminarily mold the powdered raw material 11 for forming the substrate. The evacuable frame 101 is made of a material such as, for example, graphite, and has a rotational symmetry. In the inner wall 102 of the evacuable frame 101, the aspiration holes 103 are arranged splittingly. The aspiration holes 103 are connected to the aspiration path 104. The rotation axis 106 to rotate the evacuable frame 101 is also arranged with the aspiration path 105, through which aspiration can be done. Meanwhile, the holes 103 are preferably provided with a porous filter (not shown).

However, in such a case that discharge-heating under aspiration is not necessary, the frame 101', such as the one shown in FIG. 6, may be used instead of the evacuable frame 101 shown in FIG. 5. This frame 101' is made of a material such as, for example, graphite, and has a rotational symmetry. The rotation axis 106' to rotate the frame 101' is arranged; but holes and the like are not particularly arranged on the inner wall 102'.

The powdered raw material 11 for forming the substrate is fed into the inner wall 102 of the evacuable frame 101 to preliminarily mold the powdered raw material 11 for forming the substrate to a prescribed shape in accordance with the inner wall 102 of the evacuable frame 101, thereby giving the preliminarily molded substrate 41 (refer to FIG. 7).

Specifically, the powdered raw material 11 for forming the substrate is fed gradually into the inner wall 102 of the evacuable frame 101 from a powdered raw material hopper (not shown) with rotating the evacuable frame 101 thereby molding to a shape of the container by utilizing a centrifugal force. Alternatively, thickness of the preliminarily molded substrate 41 may be controlled to the prescribed value by contacting a plate-like inner frame (not shown) to the rotating powders from inside.

A feeding method of the powdered raw material 11 for forming the substrate into the evacuable frame 101 is not particularly limited; for example, a hopper equipped with an agitation screw and a measuring feeder may be used. In this case, the powdered raw material 11 for forming the substrate filled in the hopper is fed with agitating by the agitation screw while controlling the feeding amount by the measuring feeder.

Then, as shown in FIG. 1 (3), the powdered raw material 12 for forming the inner layer is fed onto an inner surface of the preliminarily molded substrate 41 with rotating the evacuable frame 101 thereby forming the preliminarily molded inner layer 46 by preliminarily molding to the prescribed shape in accordance with the inner surface of the preliminarily molded substrate 41.

Basically, procedures similar to those in the case of feeding of the powdered raw material 11 for forming the substrate, as described above, are followed. Namely, the powdered raw material 12 for forming the inner layer is fed gradually onto the inner surface of the preliminarily molded substrate 41 from a powdered raw material hopper with rotating the evacuable frame 101 thereby molding to a shape of the container by utilizing a centrifugal force (refer to FIG. 8).

Then, as shown in FIG. 1 (4), the substrate 51 and the inner layer 56 are formed by a discharge-heat melting method.

Figure 9:
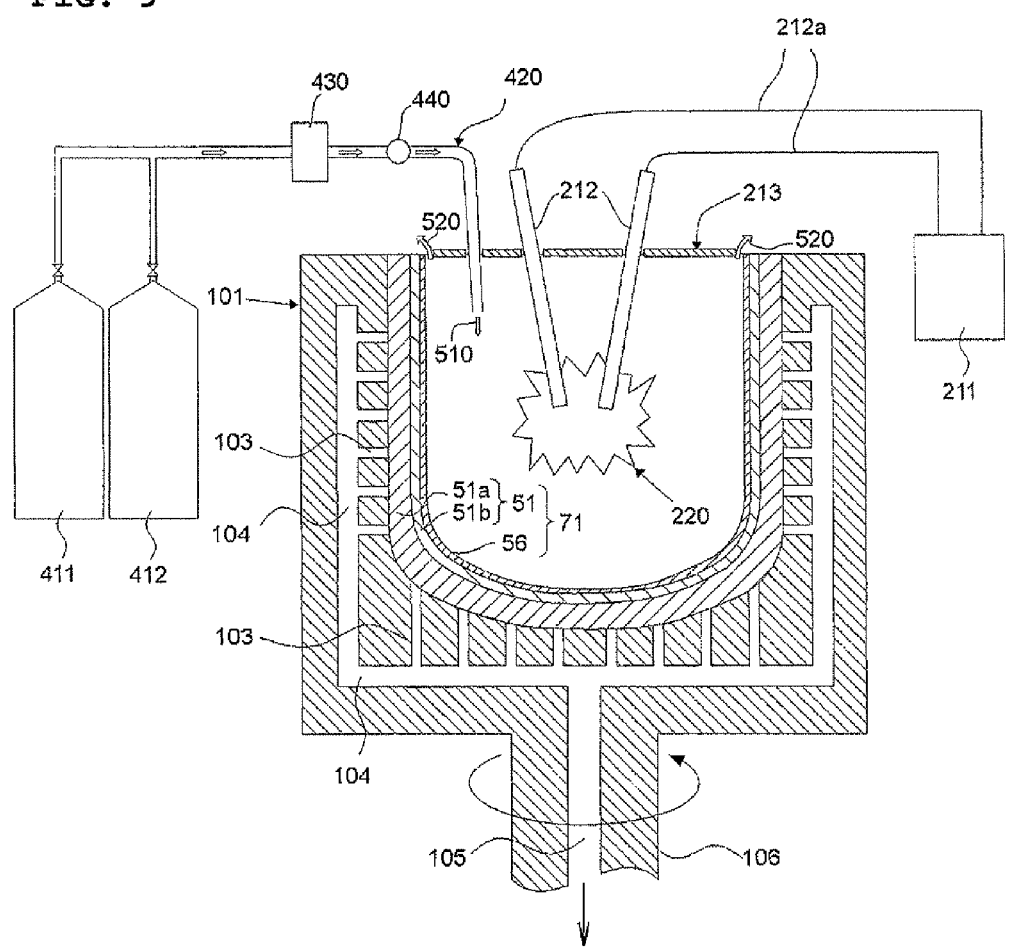
FIG. 9 is a schematic cross section view schematically showing one example of the step of discharge-heating of the preliminarily molded substrate and the preliminarily molded inner layer simultaneously in the method for producing a silica container according to the present invention.

In the case that the heat-melting is conducted under aspiration, specifically, as shown in FIG. 9, the preliminarily molded substrate 41 and the preliminarily molded inner layer 46 are degassed by aspiration from the peripheral side of the preliminarily molded substrate 41 through the aspiration holes 103 formed in the evacuable frame 101, with simultaneously heating from inside of the preliminarily molded substrate 41 and the preliminarily molded inner layer 46 by a discharge-heat melting method. With this, the substrate 51 and the inner layer 56, having made the peripheral part of the preliminarily molded substrate 41a sintered body and having made the inner part of the preliminarily molded substrate 41 and the preliminarily molded inner layer 46 a fused glass body, are formed.

On the other hand, as shown in FIG. 6, in the case that the frame 101' without especially conducting aspiration is used, the substrate 51 and the inner layer 56 are formed by heating at high temperature from inside the preliminarily molded substrate 41 and the preliminarily molded inner layer 46 by a discharge-heat melting method without especially conducting aspiration.

Hereinbelow, the embodiment that the substrate 51 and the inner layer 56 are formed by using the evacuable frame 101 under aspiration will be explained mainly; but in the case of under normal pressure, not conducting aspiration, the substrate 51 and the inner layer 56 can be formed similarly, except for conducting aspiration.

The equipment for forming the substrate 51 and the inner layer 56 is comprised of, in addition to the rotatable and evacuable frame 101 having a rotational axis symmetry as mentioned above, the rotation motor (not shown), the carbon electrodes 212 which are the heat source of the discharge-heat melting (sometimes called arc melting or arc discharge melting), the electric wirings 212a, the high voltage electricity source unit 211, the cap 213, and so forth. In addition, structural components to control an atmospheric gas to be supplied from inside the preliminarily molded inner layer 46 such as, for example, the gas-supplying cylinders 411 and 412, the gas mixture-supplying pipe 420, the dehumidifying equipment 430, the dew-point temperature meter 440, and so forth, may be arranged. From the gas-supplying cylinders 411 and 412, such gases as, for example, a hydrogen gas, a helium gas, and a nitrogen gas are supplied.

For example, in such a case that a gas containing 100% of a hydrogen gas is used as the atmospheric gas, only one gas-supplying cylinder may be used. Alternatively, an atmospheric gas, containing a hydrogen gas, or a helium gas, or a gas mixture thereof with the ratio of more than 10% by volume (hydrogen/helium-containing atmosphere), may be prepared in advance by mixing them so that the atmospheric gas thus prepared may be supplied from a single gas cylinder.

It is preferable that the step of forming the substrate 51 and the inner layer 56 by a discharge-heat melting method be conducted under an atmosphere with setting a dew-point temperature in the range between 15° C. and −15° C. and with controlling the temperature within ±2° C. of the set dew-point temperature. With this, amount of water contained in the inner layer 56 and concentration of OH group that is bonded to a silica glass network contained in the inner layer 56 can be controlled at a certain value. Amount of OH group can be decreased with lowering the dew-point temperature; wherein it is preferable that concentration of OH group be 1 to 50 ppm by weight, as described above. However, a preferable dew-point temperature can be set depending on the use of the silica container.

For example, melting and sintering of the preliminarily molded substrate 41 and the preliminarily molded inner layer 46 are carried out by the procedures as follows: at first, before start of the electricity charge between the carbon electrodes 212, supply of an atmospheric gas, whose temperature is made below the set dew-point temperature by dehumidification, containing a hydrogen gas, or a helium gas, or a gas mixture thereof with the ratio of more than 10% by volume (hydrogen/helium-containing atmosphere), is started from inside the preliminarily molded substrate 41 and the preliminarily molded inner layer 46. Specifically, as shown in FIG. 9, for example, a hydrogen gas in the gas-supplying cylinder 411 and an inert gas other than a hydrogen gas (for example, nitrogen ($N_2$), argon (Ar), and helium (He)) in the gas-supplying cylinder 412 are mixed and supplied from inside the preliminarily molded substrate 41 and the preliminarily molded inner layer 46 through the gas mixture-supplying pipe 420. Meanwhile, outlined arrows shown by the reference number 510 show the flow direction of the gas mixture.

The dew-point temperature can be set by an appropriate dehumidifying equipment and the like; and to measure the dew-point temperature, an appropriate dew-point temperature meter and the like can be used. In FIG. 9, an embodiment that the dehumidifying equipment 430 and the dew-point temperature meter 440 are integrated to the gas mixture-supplying pipe 420 is shown, but the embodiment is not limited to this; any embodiment enabling to make the dew-point temperature of the gas mixture within a prescribed range by dehumidification and the like can be used.

At this time, a gas in the evacuable frame 101 is preferably ventilated simultaneously, as mentioned above. The ventilation can be done by escaping the atmospheric gas in the evacuable frame 101 to outside, for example, through a space in the cap 213. Meanwhile, outlined arrows shown by the reference number 520 show the flow direction of the atmospheric gas by ventilation.

Then, under the condition of controlling the atmosphere as mentioned above, a vacuum pump for degassing (not shown) is started thereby aspirating the preliminarily molded substrate 41 from its outer side through the aspiration holes 103 and the aspiration paths 104 and 105 and at the same time charging of electricity between the carbon electrodes 212 is started with rotating the evacuable frame 101, containing the preliminarily molded substrate 41 and the preliminarily molded inner layer 46, at a certain constant rate.

When the arc discharge between the carbon electrodes 212 is started (shown by the reference number 220), temperature of the inner surface part of the preliminarily molded substrate 41 and the preliminarily molded inner layer 46 reaches melting region of the powdered silica (estimated temperature of about 1800 to about 2000° C.) thereby melting is started from the most surface layer. When the most surface layer is melted, degree of vacuum by aspiration with the vacuum pump for degassing increases (pressure is dropped rapidly), whereby the change to a fused silica glass layer progresses from inside to outside with degassing a dissolved gas contained in the powdered raw material 11 for forming the substrate and in the powdered raw material 12 for forming the inner layer. The timing of aspiration is important; strong aspiration should not be made before the inner surface layer inside the container is changed to a glass. The reason for this resides in that, if strong aspiration is made from the beginning, impure fine particles contained in an atmospheric gas is adhered and accumulated onto the inner surface part of the preliminarily molded articles by a filtering effect. Accordingly, it is preferable that degree of vacuum be not so high at the beginning, and aspiration is intensified gradually as the inner surface changes to a melted glass.

Heating by electric charge and aspiration by the vacuum pump are continued until about half of the entire thickness of the inner layer and the substrate is melted from inside so that the inner layer 56 may be changed to a transparent silica glass, and the inner peripheral side 51$b$ of the substrate may be changed to a part comprised of a transparent to semitransparent layer, while the outer peripheral part 51$a$ (about half of outside remained) of the substrate 51 becomes a sintered, white and opaque silica (opaque layer). Degree of vacuum is preferably $10^4$ Pa or lower, or more preferably $10^3$ Pa or lower.

With this, the silica container 71 of the present invention, as shown in FIG. 4, can be made.

Meanwhile, the inner layer 56 may be made comprised of a plurality of transparent silica glass layers having different purities and additives by further conducting, once or a plurality of times, the step of the inner layer formation in the second embodiment, as described later.

In FIG. 2, an outline of another example (second embodiment) of the method for producing the silica container 71 according to the present invention is shown.

Firstly, as shown in FIG. 2 (1), the powdered raw material 11 for forming the substrate and the powdered raw material 12 for forming the inner layer, each being a powdered silica, are prepared.

This step can be carried out in a manner similar to that of the first embodiment as mentioned above.

Then, as shown in FIG. 2 (2), the powdered raw material 11 for forming the substrate is fed to the frame having a rotational symmetry for molding.

This step also can be carried out in a manner similar to that of the first embodiment as mentioned above. However, in such a case that discharge-heating under aspiration is not necessary, the frame 101' shown in FIG. 6 may be used other than the evacuable frame 101 shown in FIG. 5 and FIG. 7, similarly to the case of the first embodiment.

Then, as shown in FIG. 2 (3), the substrate 51 is formed by a discharge-heat melting method.

Figure 10:
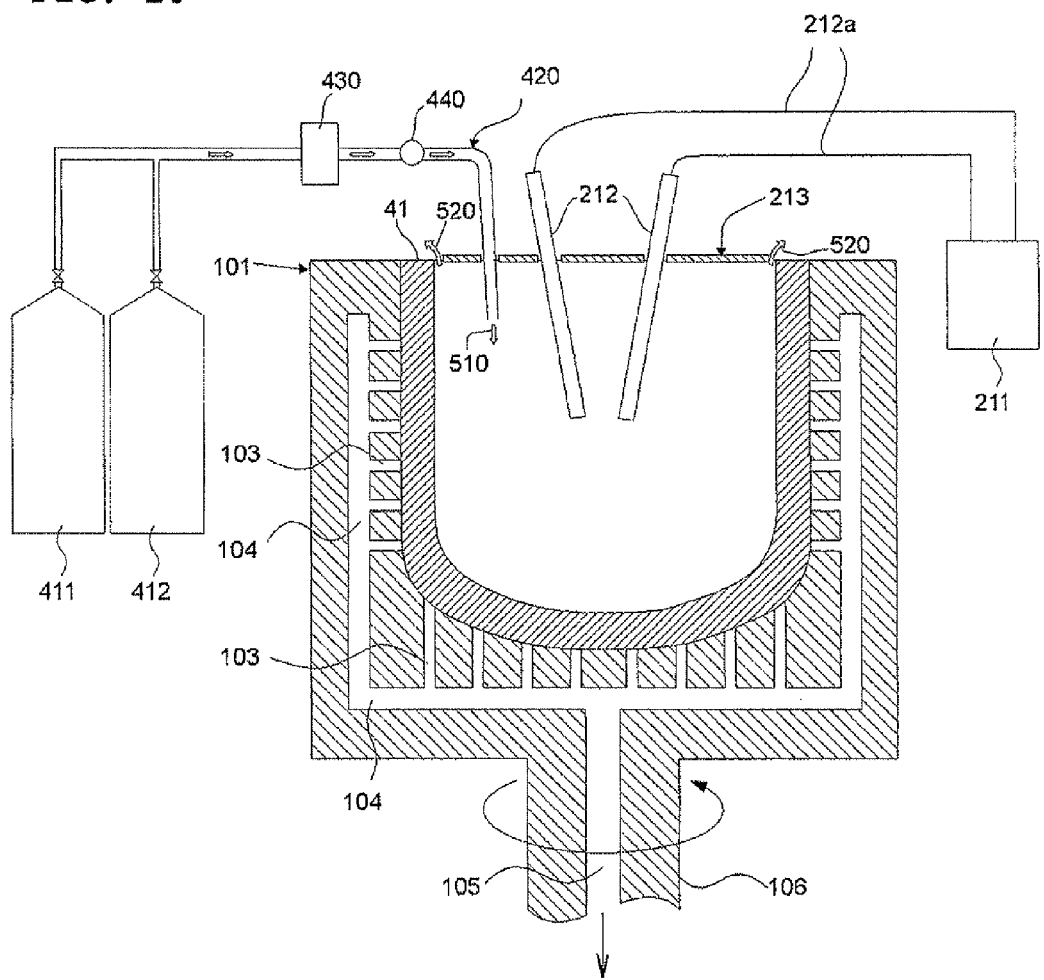
FIG. 10 is a schematic cross section view schematically showing a part of one example of the step of forming the substrate (before discharge-heat melting) in the method for producing a silica container according to the present invention.
Figure 11:
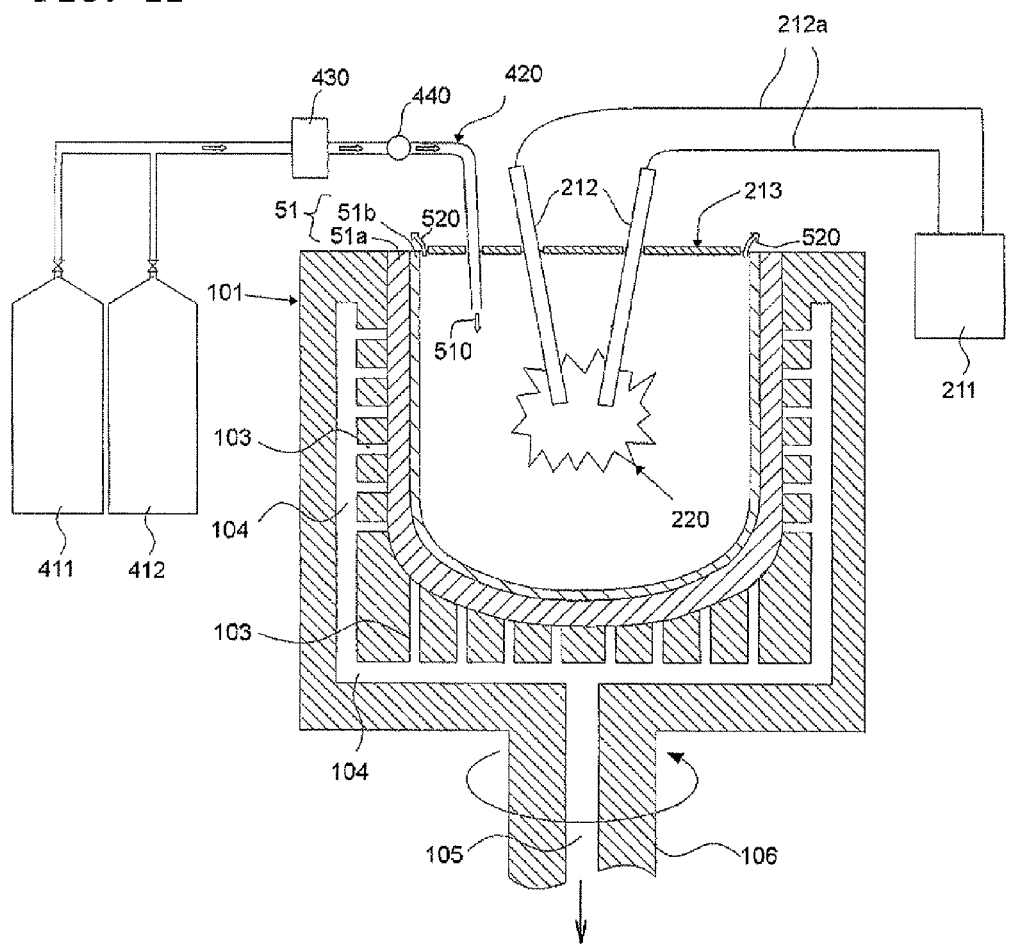
FIG. 11 is a schematic cross section view schematically showing a part of one example of the step of forming the substrate (during discharge-heat melting) in the method for producing a silica container according to the present invention.

Specifically, as shown in FIG. 10 and FIG. 11, the preliminarily molded substrate 41 is degassed by aspiration from the outer peripheral side of the preliminarily molded substrate 41 through the aspiration holes 103 formed in the evacuable frame 101, with simultaneous heating from inside of the preliminarily molded substrate by a discharge-heat melting method. With this, the substrate 51, having the outer peripheral part of the preliminarily molded substrate 41 made a sintered body and having the inner part of the preliminarily molded substrate 41 made a fused glass body, is formed.

On the other hand, as shown in FIG. 6, in the case that the frame 101' without especially conducting aspiration is used, the substrate 51 is formed by heating at high temperature from inside the preliminarily molded substrate 41 by a discharge-heat melting method without especially conducting aspiration.

Hereinbelow, the embodiment that the substrate 51 is formed by using the evacuable frame 101 under aspiration will be explained mainly; but in the case of under normal pressure, not conducting aspiration, the substrate 51 can be formed similarly, except for conducting aspiration.

The equipment for forming the substrate 51 is comprised of, as shown in FIG. 10 and FIG. 11, in addition to the foregoing rotatable and evacuable frame 101 (or may be the frame 101') having a rotational axis symmetry, the rotation motor (not shown), the carbon electrodes 212 which are the heat source of the discharge-heat melting (sometimes called arc melting or arc discharge melting), the electric wirings 212$a$, the high voltage electricity source unit 211, the cap 213, and so forth. In addition, structural components to control an atmospheric gas to be charged from inside the preliminarily molded substrate such as, for example, the gas-supplying cylinders 411 and 412, the gas mixture-supplying pipe 420, the dehumidifying equipment 430, the dew-point temperature meter 440, and so forth, may be arranged.

For example, melting and sintering of the preliminarily molded substrate 41 are conducted by the procedures as follows: at first, before start of the electricity charge between the carbon electrodes 212, supply of a hydrogen/helium-containing atmosphere whose temperature is made below the prescribed dew-point temperature by dehumidification, is started from inside the preliminarily molded substrate 41. Specifically, as shown in FIG. 10, for example, a hydrogen gas in the gas-supplying cylinder 411 and an inert gas other than a hydrogen gas (for example, nitrogen ($N_2$), argon (Ar), and helium (He)) in the inert gas-supplying cylinder 412 are mixed and supplied from inside the preliminarily molded substrate 41 through the gas mixture-supplying pipe 420. Meanwhile, outlined arrows shown by the reference number 510 show the flow direction of the gas mixture.

The dew-point temperature can be set by an appropriate dehumidifying equipment and the like; and to measure the dew-point temperature, an appropriate dew-point temperature meter and the like can be used. In FIG. 10 and FIG. 11, an embodiment that the dehumidifying equipment 430 and the dew-point temperature meter 440 are integrated to the gas mixture-supplying pipe 420 is shown, but the embodiment is not limited to this; any embodiment enabling to make the dew-point temperature of the gas mixture within a prescribed range by dehumidification and the like can be used.

At this time, a gas in the evacuable frame 101 is preferably ventilated simultaneously, as mentioned above. The ventilation can be done by escaping the atmospheric gas in the evacuable frame 101 to outside, for example, through a space in the cap 213. Meanwhile, outlined arrows shown by the reference number 520 show the flow direction of the atmospheric gas by ventilation.

Then, under the condition of controlling the atmosphere as mentioned above, a vacuum pump for degassing (not shown) is started thereby aspirating the preliminarily molded substrate 41 from its outer side through the aspiration holes 103 and the aspiration paths 104 and 105 and at the same time charging of electricity between the carbon electrodes 212 is started with rotating the evacuable frame 101 containing the preliminarily molded substrate 41 at a certain constant rate.

When the arc discharge between the carbon electrodes 212 is started (shown by the reference number 220), temperature of the inner surface part of the preliminarily molded substrate 41 reaches melting region of the powdered silica (estimated temperature of about 1800 to about 2000° C.) thereby melting is started from the most surface layer. When the most surface layer is melted, degree of vacuum by aspiration with the vacuum pump for degassing increases (pressure is dropped rapidly), whereby the change to a fused silica glass layer progresses from inside to outside with degassing a dissolved gas contained in the powdered raw material 11 for forming the substrate. The timing of aspiration is important; strong aspiration should not be made before the inner surface layer inside the container is changed to a glass. The reason for this resides in that, if strong aspiration is made from the beginning, impure fine particles contained in an atmospheric gas is adhered and accumulated onto the inner surface part of the preliminarily molded articles by a filtering effect. Accordingly, it is preferable that degree of vacuum be not so high at the beginning, and aspiration is intensified gradually as the inner surface changes to a melted glass.

Heating by electric charge and aspiration by the vacuum pump are continued until about half of the entire thickness of the substrate is melted from inside so that the inner peripheral side 51b of the substrate may be changed to a part comprised of a transparent to semitransparent layer, while the outer peripheral part 51a (about half of outside remained) of the substrate 51 may become a sintered, white and opaque silica (opaque layer). Degree of vacuum is made preferably $10^4$ Pa or lower, or more preferably $10^3$ Pa or lower.

Then, as shown in FIG. 2 (4), the inner layer 56 is formed on an inner surface of the substrate 51 with heating at high temperature from its inside by a discharge-heat melting method, while the powdered silica raw material for forming the inner layer (the powdered raw material 12 for forming the inner layer) is spread from inside of the substrate 51.

Meanwhile, the inner layer 56 may be made comprised of a plurality of transparent silica glass layers having different purities and additives by repeating this step.

The method for forming the inner layer 56 will be explained with referring to FIG. 12.

Similarly to the previous step, the equipment for forming the inner layer 56 on the inner surface of the substrate 51 is comprised of, the rotatable and evacuable frame 101 arranged with the substrate 51 having a rotational axis symmetry, the rotation motor (not shown), the powdered raw material's hopper 303 containing the powdered raw material 12 for forming the inner layer for forming the inner layer 56, the agitation screw 304, the measuring feeder 305, the carbon electrodes 212 which are the heat source of the discharge-heat melting, the electric wirings 212a, the high voltage electricity source unit 211, the cap 213, and so forth. Similarly to the previous step, in the case that the atmospheric gas is controlled, the gas-supplying cylinders 411 and 412, the gas mixture-supplying pipe 420, the dehumidifying equipment 430, the dew-point temperature meter 440, and so forth, may be arranged further.

The inner layer 56 is formed as follows: firstly, the evacuable frame 101 is set at the prescribed rotation speed, and then high voltage is loaded gradually from the high voltage electricity source unit 211 and at the same time the powdered raw material 12 for forming the inner layer for forming the inner layer 56 (high purity powdered silica) is spread gradually from top of the substrate 51 from the raw material's hopper 303. At this time, the electric discharge has been started between the carbon electrodes 212 so that inside the substrate 51 is in the temperature range of melting of the powdered silica (estimated temperature of about 1800 to about 2000° C.); and with this, the spread powdered raw material 12 for forming the inner layer becomes melted silica particles thereby attaching to the inner surface of the substrate 51. A mechanism is employed such that the carbon electrodes 212 arranged in the upper opening site of the substrate 51, a feeding port of the powdered raw material, and the cap 213 may change their positions relative to the substrate 51 to a certain degree; and by changing these positions, the inner layer 56 can be formed on the entire inner surface of the substrate 51 with a uniform thickness.

It is preferable that the step of forming the inner layer 56 by this discharge-heat melting method be conducted under an atmosphere with setting a dew-point temperature in the range between 15° C. and −15° C. and with controlling the temperature within ±2° C. of the set dew-point temperature. With this, amount of water contained in the inner layer 56 and concentration of OH group that is bonded to a silica glass network contained in the inner layer 56 can be controlled at a certain value. Amount of OH group can be decreased with lowering the dew-point temperature, wherein it is preferable that concentration of OH group be 1 to 50 ppm by weight as described above. However, a preferable dew-point temperature can be set depending on the use of the silica container.

Figure 12:
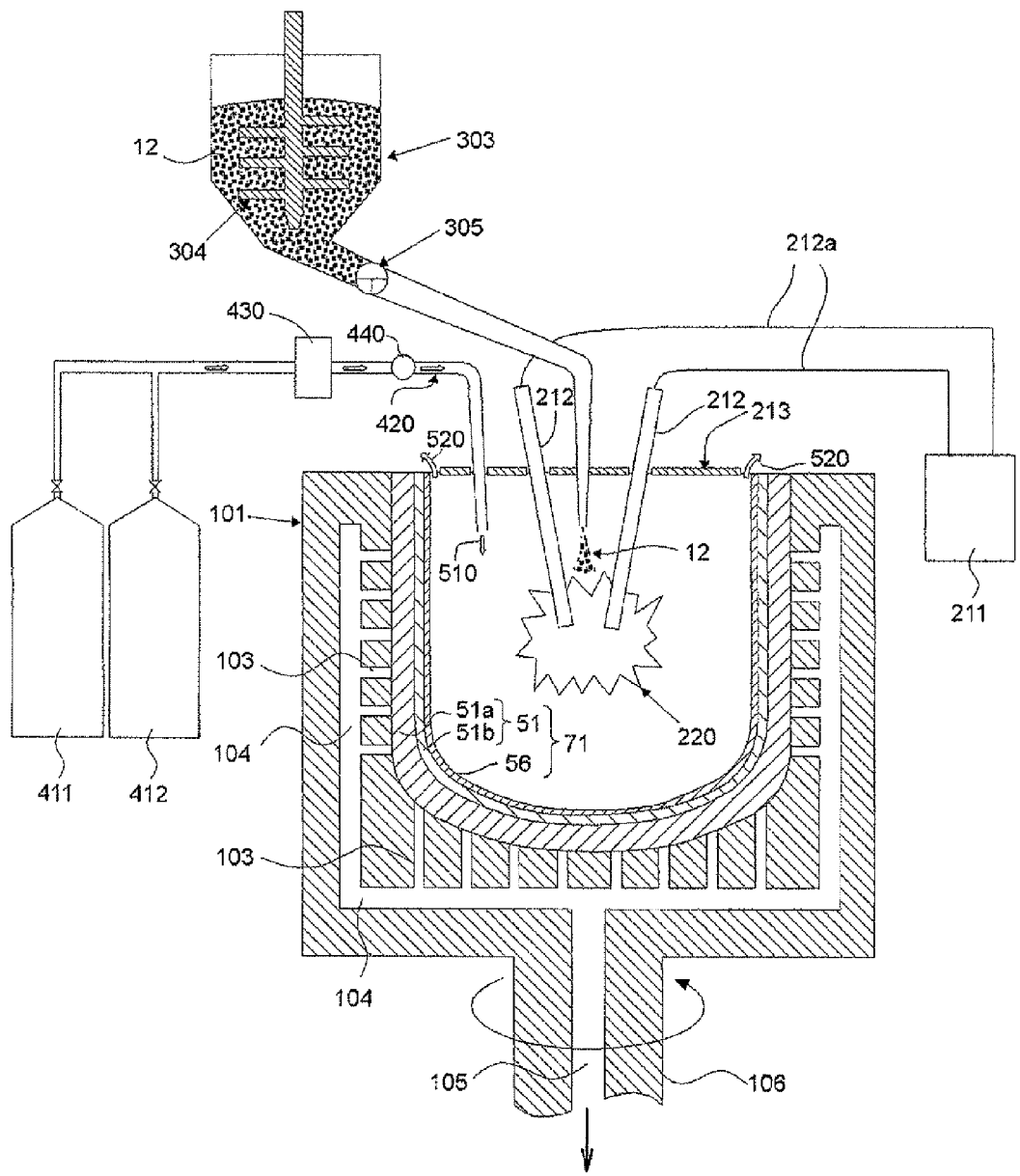
FIG. 12 is a schematic cross section view schematically showing one example of the step of forming the inner layer on an inner surface of the substrate in the method for producing a silica container according to the present invention.

Specifically, as shown in FIG. 12, a hydrogen gas in the gas-supplying cylinder 411 and an inert gas other than a hydrogen gas (for example, nitrogen, argon, and helium) in the gas-supplying cylinder 412 can be mixed and supplied from inside the substrate 51 through the gas mixture-supplying pipe 420. Meanwhile, outlined arrows shown by the reference number 510 show the flow direction of the gas mixture. At this time, the gases in the evacuable frame 101 can be ventilated simultaneously, as mentioned above. The ventilation can be done, for example, by escaping the gases of the atmosphere inside the evacuable frame 101 to outside through a space in the cap 213. Meanwhile, outlined arrows shown by the reference number 520 show the flow direction of the gas mixture by ventilation.

By conducting the foregoing steps, the silica container 71 according to the present invention as mentioned above and shown in FIG. 4 can be produced.

EXAMPLES

Hereinbelow, the present invention will be explained more specifically by showing Examples and Comparative Examples of the present invention; but the present invention is not limited to them.

Example 1

According to the method for producing a silica container of the present invention shown in FIG. 1 (the first embodiment), the silica container was produced, as described below.

Firstly, a powdered natural quartz having purity of 99.999% by weight and particle diameter of 50 to 500 μm was prepared as the powdered raw material 11 for forming the substrate.

The powdered raw material 12 for forming the inner layer was prepared according to the procedures as shown in FIG. 3. Specifically, at first, a powdered natural quartz having purity of 99.999% by weight and particle diameter of 50 to 500 μm was prepared (FIG. 3 (1)). Then, the powdered natural quartz thus prepared was soaked in an aqueous ethyl alcohol containing barium nitrate with a prescribed concentration, and then dried by heating in a clean oven at 200° C. for 50 hours (FIG. 3 (2)) to obtain the powdered raw material 12 for forming the inner layer (FIG. 3 (3)).

Then, the powdered raw material 11 for forming the substrate and the powdered raw material 12 for forming the inner layer were preliminarily molded in the frame 101 as shown in FIG. 5 by integral molding with the procedures as follows. Firstly, the powdered raw material 11 for forming the substrate was fed to the inner wall 102 of the rotating, evacuable frame 101, which is made of graphite with a column-like shape and has the aspiration holes 103 formed in the inner wall 102, with the thickness being controlled at a prescribed value (refer to FIG. 7); and then the powdered raw material 12 for forming the inner layer was fed to form the preliminarily molded inner layer 46 on the inner surface layer of the preliminarily molded substrate 41 (refer to FIG. 8).

Then, an atmosphere inside the preliminarily molded substrate 41 and the preliminarily molded inner layer 46 was displaced with a mixed gas atmosphere comprised of 30% by volume of $H_2$ and 70% by volume of He. Then, the preliminarily molded substrate 41 and the preliminarily molded inner layer 46 were sintered and fused by a discharge-heat melting method using carbon electrodes (arc discharge heating) with gradually degassing both preliminarily molded articles 41 and 46 by aspiration from outside of the frame 102 by using a vacuum pump while controlling the dew-point temperature at 10±2° C., namely in the range between 8° C. and 12° C. (refer to FIG. 9).

Example 2

The silica container 71 was produced in a manner similar to that of Example 1, except that the powdered raw material 12 for forming the inner layer was doped with Ba, the concentration being made approximately twice the amount in Example 1.

Example 3

The silica container 71 was produced in a manner similar to that of Example 1, except that the powdered raw material 12 for forming the inner layer was doped with Ba, the concentration being made approximately four times of the amount in Example 1, and with Al at the same time.

Example 4

The silica container 71 was produced in a manner similar to that of Example 1, except that the powdered raw material 12 for forming the inner layer was doped with Ba, the concentration being made approximately eight times of the amount in Example 1, and with Al at the same time.

Example 5

The silica container 71 was produced in a manner similar to that of Example 2, except that the atmosphere during the arc discharge-heating of both preliminarily molded articles under aspiration was changed to 100% by volume of $H_2$.

Example 6

The silica container 71 was produced in a manner similar to that of Example 2, except that the atmosphere during the arc discharge-heating of both of the preliminarily molded articles under aspiration was changed to 50% by volume of $H_2$ and 50% by volume of $N_2$.

Example 7

According to the method for producing a silica container shown in FIG. 2 (the second embodiment), the silica container 71 was produced.

Firstly, a powdered natural quartz having purity of 99.999% by weight and particle diameter of 50 to 500 μm was prepared as the powdered raw material 11 for forming the substrate.

The powdered raw material 12 for forming the inner layer was prepared according to the procedures as shown in FIG. 3. Specifically, at first, a powdered natural quartz having purity of 99.999% by weight and particle diameter of 50 to 500 μm was prepared (FIG. 3 (1)). Then, the powdered natural quartz thus prepared was soaked in an aqueous ethyl alcohol containing barium nitrate with a prescribed concentration, and then dried by heating in a clean oven at 200° C. for 50 hours (FIG. 3 (2)) to obtain the powdered raw material 12 for forming the inner layer (FIG. 3 (3)).

Then, the powdered raw material 11 for forming the substrate was preliminarily molded in the frame 101 as shown in FIG. 5 and with the procedure as follows. Namely, the powdered raw material 11 for forming the substrate was fed to the inner wall 102 of the rotating, evacuable frame 101, which is made of graphite with a column-like shape and has the aspiration holes 103 formed in the inner wall 102, with the thickness being controlled at a prescribed value (refer to FIG. 7).

Then, an atmosphere inside the preliminarily molded substrate 41 was displaced with a mixed gas atmosphere comprised of 30% by volume of $H_2$ and 70% by volume of He and the dew-point temperature was controlled at 10±2° C. Under this condition, the preliminarily molded substrate 41 was sintered and fused with an arc discharge heating under aspiration to form the substrate 51.

Then, under a mixed gas atmosphere comprised of 50% by volume of $H_2$ and 50% by volume of He and with controlling the dew-point temperature at 10±2° C., the inner layer 56 was formed by heating with an arc discharge-heating under normal pressure with spreading the powdered raw material 12 for forming the inner layer from top of the frame 101.

In this way, the silica container 71 was produced.

Example 8

The silica container 71 was produced in a manner similar to that of Example 7, except that the atmosphere during formation of the substrate was changed to 30% by volume of $H_2$ and 70% by volume of $N_2$.

Example 9

The silica container 71 was produced in a manner similar to that of Example 2, except that the atmosphere during the arc discharge-heating of both of the preliminarily molded articles under aspiration was changed to 15% by volume of $H_2$ and 85% by volume of $N_2$.

Example 10

The silica container 71 was produced in a manner similar to that of Example 2, except that the atmosphere during the arc discharge-heating of both of the preliminarily molded articles under aspiration was changed to 15% by volume of He and 85% by volume of $N_2$.

Comparative Example 1

A high purity powdered quartz having particle diameter of 50 to 500 μm and purity of 99.999% by weight and a powdered cristobalite having particle diameter of 50 to 300 μm and purity of 99.9999% by weight were prepared as the powdered raw material for forming the substrate and the powdered raw material for forming the inner layer, respectively. The preliminarily molded substrate and inner layer were formed in an air without particular humidity control, and then an arc discharge-heating was conducted under aspiration for melting.

Comparative Example 2

According to mostly a conventional method, a silica container (a silica crucible) was prepared as follows.

A high purity powdered quartz having particle diameter of 50 to 500 μm and purity of 99.9999% by weight and a powdered cristobalite having particle diameter of 50 to 300 μm and purity of 99.9999% by weight were prepared as the powdered raw material for forming the substrate and the powdered raw material for forming the inner layer, respectively. The substrate was formed by the arc-discharge heating under normal pressure in an air without particular humidity control, and the inner layer was formed by melting with the arc-discharge heating under normal pressure in the same air as the foregoing, with spreading the powdered raw material from upper part of the frame.

Comparative Example 3

The silica container was produced in a manner similar to that of Comparative Example 1, except that the powdered raw material for forming the inner layer doped with high concentration of Ba, i.e., 3000 ppm by weight of Ba was used.

Comparative Example 4

The silica container was produced in a manner similar to that of Comparative Example 2, except that a low-purity powdered raw material for forming the substrate with the purity of 99.99% by weight, and a high-purity powdered synthetic cristobalite doped with 100 ppm by weight of Ba as the powdered raw material for forming the inner layer were used.

Comparative Example 5

The silica container 71 was produced in a manner similar to that of Example 2, except that the atmosphere during the arc discharge-heating of both of the preliminarily molded articles under aspiration was changed to 5% by volume of $H_2$ and 95% by volume of $N_2$.

Comparative Example 6

The silica container 71 was produced in a manner similar to that of Example 2, except that the atmosphere during the arc discharge-heating of both of the preliminarily molded articles under aspiration was changed to 5% by volume of He and 95% by volume of $N_2$.

Evaluation Methods in Examples and Comparative Examples

In each Example and Comparative Example, measurements of physical properties and property evaluation as to the powdered raw material and the atmospheric gas used, and the silica container produced, were carried out as follows.

[Method for Measuring Particle Diameter of Each Powdered Raw Material]

Two-dimensional shape observation and area measurement of each powdered raw material were carried out with an optical microscope or an electron microscope. Then, the diameter was obtained by calculation of the obtained area value with the assumption that shape of the particle is a true circle. This technique was repeated statistically to obtain the range of particle diameter (99% or more by weight of particles are included in this range).

[Measurement of the Dew-Point Temperature]

Measurement was done with a dew-point temperature meter.

Meanwhile, the measurement in each Example was done by the dew-point temperature meter 440 arranged in the gas mixture-supplying pipe 420, as mentioned above.

[Analysis of the Impure Metal Element Concentration]

When an impure metal element concentration is relatively low (i.e., the glass is of high purity), ICP-AES (Inductively Coupled Plasma-Atomic Emission Spectroscopy) or ICP-MS (Inductively Coupled Plasma-Mass Spectroscopy) was used, and when an impure metal element concentration is relatively high (i.e., the glass is of low purity), AAS (Atomic Absorption Spectroscopy) was used.

[Thickness Measurement of Each Layer]

The container cross section at the half point of total height of the side wall of the silica container (corresponding to the height of 200 mm) was measured by a scale to obtain thickness of the substrate and the inner layer.

[Measurement of OH Group Concentration]

Each sample was obtained by cutting out a transparent part of the substrate and the inner layer, respectively, and then polishing it. The measurement was done for each sample with an infrared absorption spectroscopy. Conversion to the OH group concentration was done according to the following literature:

Dodd, D. M. and Fraser, D. B., (1966), "Optical determination of OH in fused silica", Journal of Applied Physics, vol. 37, p. 3911.

[Measurement of Release Amount of a Steam Gas]

The gas amount released from a granular silica glass sample with the particle diameter controlled in the range from 100 μm to 1 mm upon heating at 1000° C. under vacuum was measured by a mass spectrometry instrument. Details of the measurement were according to the following literature. The amount was expressed by the released molecules per unit mass (water molecules/glass gram) with the assumption that all of water, $H_2O$ molecules contained therein were released.

Nasu, S., et al., (1990), "Gas release of various kinds of vitreous silica", Journal of Illuminating Engineering Institute of Japan, vol. 74, No. 9, pp 595 to 600.

[Measurement of Light Transmittance]

A glass sample with the size of about 5×5 mm (thickness of about 11 mm) was cut out from the inner layer to obtain a sample having 10-mm thickness finished with both surfaces being parallel and optically polished (surface precision: 1/20λ, wavelength: 633 nm). Then, the linear light transmittance (the value called optical transmission, obtained by subtracting reflection at the sample surface, back-side reflection of inside the sample, and absorption of the sample itself from the incident light which was taken as 100%) of this glass sample was measured at a wavelength of 600 nm by using a visible light transmittance measurement instrument having a mercury lamp as its light source. Maximum value of the theoretical transmittance is 93.2%.

The incident light is scattered by micro gaseous bubbles, microparticles, clusters, and the like contained in a glass sample; and thus, the value of light transmittance is effective for judgment that various elements are dissolved in a silica glass uniformly and without gaseous bubbles.

[Evaluation of Continuous Pulling Up of a Silicon Single Crystal (Multipulling)]

A metal polysilicon with purity of 99.9999999% by weight was fed into a produced silica container; thereafter, the temperature was raised to form a silicon melt, and then pulling up of a single crystal silicon was repeated for three times (multipulling). The evaluation was made as the success rate of single crystal growth. The pulling up conditions were: atmosphere of an argon (Ar) gas 100% with the pressure inside the CZ equipment being $10^3$ Pa, the pulling up rate of 1 mm/minute, rotation rate of 10 rpm, and the size of the silicon single crystal being 150 mm in diameter and 150 mm in length. Operation time for one batch was set at about 12 hours.

Classification of evaluation based on the success rate of single crystal growth for repetition of three times was made as follows:

success of three times: good
success of two times: fair
success of one time: poor

[Evaluation of Voids and Pinholes]

In the foregoing multipulling of the silicon single crystal, ten of each silicon wafer having the size of 150 mm diameter and 200 μm thickness and polished on the both sides were prepared from an arbitrary portion of the second silicon single crystal after multipulling of each silicon single crystal. Then, voids and pinholes present on both sides of each silicon wafer were counted; average void numbers and pinhole numbers per unit area ($m^2$) were obtained by a statistic numerical treatment.

average number of voids and pinholes is less than $1/m^2$: good
average number of voids and pinholes is in the range from 1 to $2/m^2$: fair
average number of voids and pinholes is $3/m^2$ or more: poor

[Evaluation of Etching Resistance of the Silica Container]

A sample was cut out from the side wall of the silica container after three multipullings of a silicon single crystal, in the part lower than the level of the silicon melt. The sample was made for the size of the inner wall surface of the silica container to be set to 100 mm×100 mm with full thickness in the thickness direction. Then, the etched amount in the inner wall of the inner layer was obtained by measuring the sample's cross section by a scale.

etched thickness of inner layer is less than 3 mm: good
etched thickness of inner layer is in the range from 3 mm to less than 5 mm: fair
etched thickness of inner layer is 5 mm or more: poor

[Evaluation of Gaseous Bubble Expansion in the Transparent Silica Glass Layer of the Container Side Wall]

A sample was cut out from the side wall of the silica container after three multipullings of a silicon single crystal, in the part lower than the level of the silicon melt. The sample was made for the size of the inner wall surface of the silica container to be set to 100 mm×100 mm with full thickness in the thickness direction. Then, gaseous bubbles in the inner layer were observed by a stereoscopic microscope for relative evaluation of the gaseous bubble expansion. Comparative Example 2 was used as the standard of a conventional level.

almost no expansion observed good
slight expansion observed fair
same level of expansion as conventional observation poor

[Evaluation of (Relative) Production Cost of the Silica Container]

The production cost of the silica container was evaluated. In particular, costs associated with silica raw materials, a melting energy, and the like were summed up for the relative evaluation. The cost by a conventional method was based on Comparative Example 2.

low cost (less than 50% relative to cost of the conventional method): good
moderate cost (50 to less than 100% relative to cost of the conventional method): fair
high cost (cost of the conventional method was taken as 100%): poor Production conditions, measured physical properties, and evaluation results of each silica container produced in Examples 1 to 10 and Comparative Examples 1 to 6 are summarized in the following Tables 1 to 8.

TABLE 1

| Example No. | | Example 1 | Example 2 |
| --- | --- | --- | --- |
| Powdered substrate's raw material | | Powdered natural silica<br>Particle diameter: 50 to 500 μm<br>Purity: 99.999% by weight | Powdered natural silica<br>Particle diameter: 50 to 500 μm<br>Purity: 99.999% by weight |
| Powdered<br>inner-<br>layer's | Powdered base material | Powdered natural silica<br>Particle diameter: 50 to 500 μm<br>Purity: 99.999% by weight | Powdered natural silica<br>Particle diameter: 50 to 500 μm<br>Purity: 99.999% by weight |

TABLE 1-continued

| Example No. | | Example 1 | Example 2 |
|---|---|---|---|
| raw material | Doping concentration of alkaline earth metal element (ppm by weight) | Ba: 110 | Ba: 200 |
| | Atmosphere, temperature, and time of heating and drying treatment | Air, 200° C., 50 hours | Air, 200° C., 50 hours |
| Order of preliminary molding and heating of each layer | | Preliminary molding of substrate and inner layer, followed by simultaneous heating | Preliminary molding of substrate and inner layer, followed by simultaneous heating |
| Preliminary molding of substrate | | Rotation molding within frame | Rotation molding within frame |
| Preliminary molding of inner layer | | Rotation molding within frame | Rotation molding within frame |
| Melting and sintering method of substrate | | Arc discharge heating under aspiration | Arc discharge heating under aspiration |
| Atmosphere during melting and sintering of substrate | | $H_2$: 30% by volume, He: 70% by volume | $H_2$: 30% by volume, He: 70% by volume |
| Melting method of inner layer | | Arc discharge heating under aspiration | Arc discharge heating under aspiration |
| Atmosphere of inner layer melting | | $H_2$: 30% by volume, He: 70% by volume | $H_2$: 30% by volume, He: 70% by volume |
| Physical properties of substrate | Outer diameter/height/thickness (mm) | Outer diameter 450/height 400/thickness 10 | Outer diameter 450/height 400/thickness 10 |
| | Color tone | Outside: white opaque Inside: transparent | Outside: white opaque Inside: transparent |
| | OH group concentration (ppm by weight) | 30 | 30 |
| | Alkaline metal concentration (ppm by weight) | Li: 1, Na: 5, K: 1 | Li: 1, Na: 5, K: 1 |
| | Light transmittance (%) at wavelength of 600 nm (Inner peripheral part) | 91.9 | 91.9 |
| Physical properties of inner layer | Thickness (mm) | 5 | 5 |
| | Color tone | Colorless and transparent | Colorless and transparent |
| | OH group concentration (ppm by weight) | 20 | 20 |
| | Al Concentration (ppm by weight) | 3 | 3 |
| | Alkaline earth metal concentration (ppm by weight) | Ba: 100 | Ba: 180 |
| | Alkaline metal concentration (ppb by weight) | Li: 1, Na: 3, K: 1 | Li: 1, Na: 4, K: 1 |
| | Release amount of water molecules (molecules/g) | $<1 \times 10^{17}$ | $<1 \times 10^{17}$ |
| | Light transmittance (%) at wavelength of 600 nm | 92.9 | 92.8 |
| Evaluation | Single crystal multipulling | Fair | Good |
| | Void/pinhole of single crystal | Good | Good |
| | Container etching resistance | Fair | Good |
| | Expansion of container gaseous bubbles | Good | Good |
| | Production cost of container | Fair | Fair |

TABLE 2

| Example No. | | Example 3 | Example 4 |
|---|---|---|---|
| Powdered substrate's raw material | | Powdered natural silica Particle diameter: 50 to 500 μm Purity: 99.999% by weight | Powdered natural silica Particle diameter: 50 to 500 μm Purity: 99.999% by weight |
| Powdered inner-layer's raw material | Powdered base material | Powdered natural silica Particle diameter: 50 to 500 μm Purity: 99.999% by weight | Powdered natural silica Particle diameter: 50 to 500 μm Purity: 99.999% by weight |
| | Doping concentration of alkaline earth metal element (ppm by weight) | Ba: 400 | Ba: 800 |
| | Atmosphere, temperature, and time of heating and drying treatment | Air, 200° C., 50 hours | Air, 200° C., 50 hours |
| Order of preliminary molding and heating of each layer | | Preliminary molding of substrate and inner layer, followed by simultaneous heating | Preliminary molding of substrate and inner layer, followed by simultaneous heating |
| Preliminary molding of substrate | | Rotation molding within frame | Rotation molding within frame |
| Preliminary molding of inner layer | | Rotation molding within frame | Rotation molding within frame |

TABLE 2-continued

| Example No. | | Example 3 | Example 4 |
|---|---|---|---|
| Melting and sintering method of substrate | | Arc discharge heating under aspiration | Arc discharge heating under aspiration |
| Atmosphere during melting and sintering of substrate | | $H_2$: 30% by volume, He: 70% by volume | $H_2$: 30% by volume, He: 70% by volume |
| Melting method of inner layer | | Arc discharge heating under aspiration | Arc discharge heating under aspiration |
| Atmosphere of inner layer melting | | $H_2$: 30% by volume, He: 70% by volume | $H_2$: 30% by volume, He: 70% by volume |
| Physical properties of substrate | Outer diameter/height/ thickness (mm) | Outer diameter 450/height 400/ thickness 10 | Outer diameter 450/height 400/ thickness 10 |
| | Color tone | Outside: white opaque Inside: transparent | Outside: white opaque Inside: transparent |
| | OH group concentration (ppm by weight) | 20 | 35 |
| | Alkaline metal concentration (ppm by weight) | Li: 1, Na: 5, K: 1 | Li: 1, Na: 5, K: 1 |
| | Light transmittance (%) at wavelength of 600 nm (Inner peripheral part) | 91.9 | 91.8 |
| Physical properties of inner layer | Thickness (mm) | 5 | 5 |
| | Color tone | Colorless and transparent | Colorless and transparent |
| | OH group concentration (ppm by weight) | 15 | 25 |
| | Al Concentration (ppm by weight) | 30 | 80 |
| | Alkaline earth metal concentration (ppm by weight) | Ba: 370 | Ba: 740 |
| | Alkaline metal concentration (ppb by weight) | Li: 1, Na: 2, K: 1 | Li: 1, Na: 3, K: 2 |
| | Release amount of water molecules (molecules/g) | $<1 \times 10^{17}$ | $<1 \times 10^{17}$ |
| | Light transmittance (%) at wavelength of 600 nm | 92.5 | 91.8 |
| Evaluation | Single crystal multipulling | Good | Good |
| | Void/pinhole of single crystal | Good | Fair |
| | Container etching resistance | Good | Good |
| | Expansion of container gaseous bubbles | Good | Good |
| | Production cost of container | Fair | Pair |

TABLE 3

| Example No. | | Example 5 | Example 6 |
|---|---|---|---|
| Powdered substrate's raw material | | Powdered natural silica Particle diameter: 50 to 500 μm Purity: 99.999% by weight | Powdered natural silica Particle diameter: 50 to 500 nm Purity: 99.999% by weight |
| Powdered inner-layer's raw material | Powdered base material | Powdered natural silica Particle diameter: 50 to 500 μm Purity: 99.999% by weight | Powdered natural silica Particle diameter: 50 to 500 μm Purity: 99.999% by weight |
| | Doping concentration of alkaline earth metal element (ppm by weight) | Ba: 200 | Ba: 200 |
| | Atmosphere, temperature, and time of heating and drying treatment | Air, 200° C., 50 hours | Air, 200° C., 50 hours |
| Order of preliminary molding and heating of each layer | | Preliminary molding of substrate and inner layer, followed by simultaneous heating | Preliminary molding of substrate and inner layer, followed by simultaneous heating |
| Preliminary molding of substrate | | Rotation molding within frame | Rotation molding within frame |
| Preliminary molding of inner layer | | Rotation molding within frame | Rotation molding within frame |
| Melting and sintering method of substrate | | Arc discharge heating under aspiration | Arc discharge heating under aspiration |
| Atmosphere during melting and sintering of substrate | | $H_2$: 100% by volume | $H_2$: 50% by volume, $N_2$: 50% by volume |
| Melting method of inner layer | | Arc discharge heating under aspiration | Arc discharge heating under aspiration |
| Atmosphere of inner layer melting | | $H_2$: 100% by volume | $H_2$: 50% by volume, $N_2$: 50% by volume |
| Physical properties of substrate | Outer diameter/height/ thickness (mm) | Outer diameter 450/height 400/ thickness 10 | Outer diameter 450/height 400/ thickness 10 |
| | Color tone | Outside: white opaque Inside: transparent | Outside: white opaque Inside: transparent |

TABLE 3-continued

| | Example No. | Example 5 | Example 6 |
|---|---|---|---|
| | OH group concentration (ppm by weight) | 10 | 15 |
| | Alkaline metal concentration (ppm by weight) | Li: 1, Na: 5, K: 1 | Li: 1, Na: 5, K: 1 |
| | Light transmittance (%) at wavelength of 600 nm (Inner peripheral part) | 92.0 | 91.8 |
| Physical properties of inner layer | Thickness (mm) | 5 | 5 |
| | Color tone | Colorless and transparent | Colorless and transparent |
| | OH group concentration (ppm by weight) | 5 | 10 |
| | Al Concentration (ppm by weight) | 3 | 3 |
| | Alkaline earth metal concentration (ppm by weight) | Ba: 180 | Ba: 180 |
| | Alkaline metal concentration (ppb by weight) | Li: 1, Na: 2, K: 1 | Li: 1, Na: 4, K: 2 |
| | Release amount of water molecules (molecules/g) | $<1 \times 10^{17}$ | $<1 \times 10^{17}$ |
| | Light transmittance (%) at wavelength of 600 nm | 93.1 | 92.0 |
| Evaluation | Single crystal multipulling | Good | Good |
| | Void/pinhole of single crystal | Good | Good |
| | Container etching resistance | Good | Good |
| | Expansion of container gaseous bubbles | Good | Fair |
| | Production cost of container | Fair | Fair |

TABLE 4

| | Example No. | Example 7 | Example 8 |
|---|---|---|---|
| Powdered substrate's raw material | | Powdered natural silica Particle diameter: 50 to 500 μm Purity: 99.999% by weight | Powdered natural silica Particle diameter: 50 to 500 μm Purity: 99.999% by weight |
| Powdered inner-layer's raw material | Powdered base material | Powdered natural silica Particle diameter: 50 to 500 μm Purity: 99.999% by weight Ba: 200 | Powdered natural silica Particle diameter: 50 to 500 μm Purity: 99.999% by weight Ba: 200 |
| | Doping concentration of alkaline earth metal element (ppm by weight) | | |
| | Atmosphere, temperature, and time of heating and drying treatment | Air, 200° C., 50 hours | Air, 200° C., 50 hours |
| Order of preliminary molding and heating of each layer | | Preliminary molding of substrate and melting and sintering of substrate, followed by spreading of powdered inner-layer's raw material and heating | Preliminary molding of substrate and melting and sintering of substrate, followed by spreading of powdered inner-layer's raw material and heating |
| Preliminary molding of substrate | | Rotation molding within frame | Rotation molding within frame |
| Preliminary molding of inner layer | | None | None |
| Melting and sintering method of substrate | | Arc discharge heating under aspiration | Arc discharge heating under aspiration |
| Atmosphere during melting and sintering of substrate | | $H_2$: 30% by volume, He: 70% by volume | $H_2$: 30% by volume, $N_2$: 70% by volume |
| Melting method of inner layer | | Spreading of powdered raw material and arc discharge heating under normal pressure | Spreading of powdered raw material and arc discharge heating under normal pressure |
| Atmosphere of inner layer melting | | $H_2$: 50% by volume, He: 50% by volume | $H_2$: 50% by volume, He: 50% by volume |
| Physical properties of substrate | Outer diameter/height/thickness (mm) | Outer diameter 450/height 400/thickness 10 | Outer diameter 450/height 400/thickness 10 |
| | Color tone | Outside: white opaque Inside: transparent | Outside: white opaque Inside: transparent |
| | OH group concentration (ppm by weight) | 13 | 15 |
| | Alkaline metal concentration (ppm by weight) | Li: 1, Na: 3, K: 2 | Li: 1, Na: 4, K: 1 |
| | Light transmittance (%) at wavelength of 600 nm (Inner peripheral part) | 92.0 | 92.0 |

TABLE 4-continued

| Example No. | | Example 7 | Example 8 |
|---|---|---|---|
| Physical properties of inner layer | Thickness (mm) | 5 | 5 |
| | Color tone | Colorless and transparent | Colorless and transparent |
| | OH group concentration (ppm by weight) | 10 | 10 |
| | Al Concentration (ppm by weight) | 3 | 3 |
| | Alkaline earth metal concentration (ppm by weight) | Ba: 180 | Ba: 180 |
| | Alkaline metal concentration (ppb by weight) | Li: <1, Na: <1, K: <1 | Li: <1, Na: <1, K: <1 |
| | Release amount of water molecules (molecules/g) | $<1 \times 10^{17}$ | $<1 \times 10^{17}$ |
| | Light transmittance (%) at wavelength of 600 nm | 92.8 | 91.9 |
| Evaluation | Single crystal multipulling | Good | Good |
| | Void/pinhole of single crystal | Good | Good |
| | Container etching resistance | Good | Good |
| | Expansion of container gaseous bubbles | Good | Fair |
| | Production cost of container | Fair | Fair |

TABLE 5

| Example No. | | Example 9 | Example 10 |
|---|---|---|---|
| Powdered substrate's raw material | | Powdered natural silica Particle diameter: 50 to 500 μm Purity: 99.999% by weight | Powdered natural silica Particle diameter: 50 to 500 μm Purity: 99.999% by weight |
| Powdered inner-layer's raw material | Powdered base material | Powdered natural silica Particle diameter: 50 to 500 μm Purity: 99.999% by weight | Powdered natural silica Particle diameter: 50 to 500 μm Purity: 99.999% by weight |
| | Doping concentration of alkaline earth metal element (ppm by weight) | Ba: 200 | Ba: 200 |
| | Atmosphere, temperature, and time of heating and drying treatment | Air, 200° C., 50 hours | Air, 200° C., 50 hours |
| Order of preliminary molding and heating of each layer | | Preliminary molding of substrate and inner layer, followed by simultaneous heating | Preliminary molding of substrate and inner layer, followed by simultaneous heating |
| Preliminary molding of substrate | | Rotation molding within frame | Rotation molding within frame |
| Preliminary molding of inner layer | | Rotation molding within frame | Rotation molding within frame |
| Melting and sintering method of substrate | | Arc discharge heating under aspiration | Arc discharge heating under aspiration |
| Atmosphere during melting and sintering of substrate | | $H_2$: 15% by volume, $N_2$: 85% by volume | He: 15% by volume, $N_2$: 85% by volume |
| Melting method of inner layer | | Arc discharge heating under aspiration | Arc discharge heating under aspiration |
| Atmosphere of inner layer melting | | $H_2$: 15% by volume, $N_2$: 85% by volume | He: 15% by volume, $N_2$: 85% by volume |
| Physical properties of substrate | Outer diameter/height/ thickness (mm) | Outer diameter 450/height 400/ thickness 10 | Outer diameter 450/height 400/ thickness 10 |
| | Color tone | Outside: white opaque Inside: transparent | Outside: white opaque Inside: transparent |
| | OH group concentration (ppm by weight) | 20 | 30 |
| | Alkaline metal concentration (ppm by weight) | Li: 1, Na: 5, K: 1 | Li: 1, Na: 5, K: 1 |
| | Light transmittance (%) at wavelength of 600 nm (Inner peripheral part) | 91.9 | 91.9 |
| Physical properties of inner layer | Thickness (mm) | 5 | 5 |
| | Color tone | Colorless and transparent | Colorless and transparent |
| | OH group concentration (ppm by weight) | 5 | 10 |
| | Al Concentration (ppm by weight) | 10 | 10 |
| | Alkaline earth metal concentration (ppm by weight) | Ba: 180 | Ba: 180 |
| | Alkaline metal concentration (ppb by weight) | Li: 1, Na: 2, K: 1 | Li: 1, Na: 4, K: 2 |

TABLE 5-continued

| | Example No. | Example 9 | Example 10 |
|---|---|---|---|
| | Release amount of water molecules (molecules/g) | $<1 \times 10^{17}$ | $<1 \times 10^{17}$ |
| | Light transmittance (%) at wavelength of 600 nm | 92.0 | 91.8 |
| Evaluation | Single crystal multipulling | Good | Fair |
| | Void/pinhole of single crystal | Good | Good |
| | Container etching resistance | Good | Good |
| | Expansion of container gaseous bubbles | Fair | Fair |
| | Production cost of container | Fair | Fair |

TABLE 6

| | Example No. | Comparative Example 1 | Comparative Example 2 |
|---|---|---|---|
| Powdered substrate's raw material | | Powdered natural silica Particle diameter: 50 to 500 μm Purity: 99.999% by weight | Powdered natural silica Particle diameter: 50 to 500 μm Purity: 99.9999% by weight |
| Powdered inner-layer's raw material | Powdered base material | Powdered synthetic cristobalite Particle diameter: 50 to 300 μm Purity: 99.9999% by weight | Powdered synthetic cristobalite Particle diameter: 50 to 300 μm Purity: 99.9999% by weight |
| | Doping concentration of alkaline earth metal element (ppm by weight) | None | None |
| | Atmosphere, temperature, and time of heating and drying treatment | None | None |
| Order of preliminary molding and heating of each layer | | Preliminary molding of substrate and inner layer, followed by simultaneous heating | Preliminary molding of substrate and melting and sintering of substrate, followed by spreading of powdered inner-layer's raw material and heating |
| Preliminary molding of substrate | | Rotation molding within frame | Rotation molding within frame |
| Preliminary molding of inner layer | | Rotation molding within frame | None |
| Melting and sintering method of substrate | | Arc discharge heating under aspiration | Arc discharge heating under normal pressure |
| Atmosphere during melting and sintering of substrate | | Air | Air |
| Melting method of inner layer | | Arc discharge heating under aspiration | Spreading of powdered raw material and arc discharge heating under normal pressure |
| Atmosphere of inner layer melting | | Air | Air |
| Physical properties of substrate | Outer diameter/height/ thickness (mm) | Outer diameter 450/height 400/ thickness 10 | Outer diameter 450/height 400/ thickness 10 |
| | Color tone | Outside: white opaque Inside: transparent | Outside: white opaque Inside: white opaque |
| | OH group concentration (ppm by weight) | 80 | 130 |
| | Alkaline metal concentration (ppm by weight) | Li: 1, Na: 3, K: 1 | Li: <0.1, Na: <0.1, K: <0.1 |
| | Light transmittance (%) at wavelength of 600 nm (Inner peripheral part) | 91.5 | 75.2 |
| Physical properties of inner layer | Thickness (mm) | 5 | 5 |
| | Color tone | Colorless and transparent | Colorless and transparent |
| | OH group concentration (ppm by weight) | 120 | 180 |
| | Al Concentration (ppm by weight) | 3 | 3 |
| | Alkaline earth metal concentration (ppm by weight) | Ba: <1 | Ba: <1 |
| | Alkaline metal concentration (ppb by weight) | Li: <1, Na: <1, K: <1 | Li: <1, Na: <1, K: <1 |
| | Release amount of water molecules (molecules/g) | $1 \times 10^{17}$ | $3 \times 10^{17}$ |
| | Light transmittance (%) at wavelength of 600 nm | 92.5 | 91.6 |

TABLE 6-continued

| Example No. | Comparative Example 1 | Comparative Example 2 |
|---|---|---|
| Evaluation Single crystal multipulling | Fair | Fair |
| Void/pinhole of single crystal | Fair | Fair |
| Container etching resistance | Poor | Poor |
| Expansion of container gaseous bubbles | Fair | Poor |
| Production cost of container | Fair | Poor |

TABLE 7

| | Example No. | Comparative Example 3 | Comparative Example 4 |
|---|---|---|---|
| Powdered substrate's raw material | | Powdered natural silica Particle diameter: 50 to 500 μm Purity: 99.999% by weight | Powdered natural silica Particle diameter: 50 to 500 μm Purity: 99.99% by weight |
| Powdered inner-layer's raw material | Powdered base material | Powdered synthetic cristobalite Particle diameter: 50 to 300 μm Purity: 99.9999% by weight | Powdered synthetic cristobalite Particle diameter: 50 to 300 μm Purity: 99.9999% by weight |
| | Doping concentration of alkaline earth metal element (ppm by weight) | Ba: 3000 | Ba: 100 |
| | Atmosphere, temperature, and time of heating and drying treatment | Air, 200° C., 100 hours | Air, 200° C., 50 hours |
| Order of preliminary molding and heating of each layer | | Preliminary molding of substrate and inner layer, followed by simultaneous heating | Preliminary molding of substrate and melting and sintering of substrate, followed by spreading of powdered inner-layer's raw material and heating |
| Preliminary molding of substrate | | Rotation molding within frame | Rotation molding within frame |
| Preliminary molding of inner layer | | Rotation molding within frame | None |
| Melting and sintering method of substrate | | Arc discharge heating under aspiration | Arc discharge heating under normal pressure |
| Atmosphere during melting and sintering of substrate | | Air | Air |
| Melting method of inner layer | | Arc discharge heating under aspiration | Spreading of powdered raw material and arc discharge heating under normal pressure |
| Atmosphere of inner layer melting | | Air | Air |
| Physical properties of substrate | Outer diameter/height/ thickness (mm) | Outer diameter 450/height 400/ thickness 10 | Outer diameter 450/height 400/ thickness 10 |
| | Color tone | Outside: white opaque Inside: transparent | Outside: white opaque Inside: white opaque |
| | OH group concentration (ppm by weight) | 90 | 70 |
| | Alkaline metal concentration (ppm by weight) | Li: 1, Na: 2, K: 1 | Li: 8, Na: 56, K: 10 |
| | Light transmittance (%) at wavelength of 600 nm (Inner peripheral part) | 90.1 | 73.7 |
| Physical properties of inner layer | Thickness (mm) | 5 | 5 |
| | Color tone | White and semitransparent | White and semitransparent |
| | OH group concentration (ppm by weight) | 130 | 120 |
| | Al Concentration (ppm by weight) | 3 | 3 |
| | Alkaline earth metal concentration (ppm by weight) | Ba: 2500 | Ba: 80 |
| | Alkaline metal concentration (ppb by weight) | Li: <1, Na: <1, K: <1 | Li: <1, Na: <1, K: <1 |
| | Release amount of water molecules (molecules/g) | $1 \times 10^{17}$ | $3 \times 10^{17}$ |
| | Light transmittance (%) at wavelength of 600 nm | 87.4 | 89.8 |
| Evaluation | Single crystal multipulling | Poor | Poor |
| | Void/pinhole of single crystal | Poor | Poor |
| | Container etching resistance | Good | Good |
| | Expansion of container gaseous bubbles | Fair | Fair |

TABLE 7-continued

| Example No. | Comparative Example 3 | Comparative Example 4 |
|---|---|---|
| Production cost of container | Fair | Good |

TABLE 8

| | Example No. | Comparative Example 5 | Comparative Example 6 |
|---|---|---|---|
| | Powdered substrate's raw material | Powdered natural silica<br>Particle diameter: 50 to 500 nm<br>Purity: 99.999% by weight | Powdered natural silica<br>Particle diameter: 50 to 500 μm<br>Purity: 99.999% by weight |
| Powdered inner-layer's raw material | Powdered base material | Powdered natural silica<br>Particle diameter: 50 to 500 μm<br>Purity: 99.999% by weight | Powdered natural silica<br>Particle diameter: 50 to 500 μm<br>Purity: 99.999% by weight |
| | Doping concentration of alkaline earth metal element (ppm by weight) | Ba: 200 | Ba: 200 |
| | Atmosphere, temperature, and time of heating and drying treatment | Air, 200° C., 50 hours | Air, 200° C., 50 hours |
| | Order of preliminary molding and heating of each layer | Preliminary molding of substrate and inner layer, followed by simultaneous heating | Preliminary molding of substrate and inner layer, followed by simultaneous heating |
| | Preliminary molding of substrate | Rotation molding within frame | Rotation molding within frame |
| | Preliminary molding of inner layer | Rotation molding within frame | Rotation molding within frame |
| | Melting and sintering method of substrate | Arc discharge heating under aspiration | Arc discharge heating under aspiration |
| | Atmosphere during melting and sintering of substrate | $H_2$: 5% by volume, $N_2$: 95% by volume | He: 5% by volume, $N_2$: 95% by volume |
| | Melting method of inner layer | Arc discharge heating under aspiration | Arc discharge heating under aspiration |
| | Atmosphere of inner layer melting | $H_2$: 5% by volume, $N_2$: 95% by volume | He: 5% by volume, $N_2$: 95% by volume |
| Physical properties of substrate | Outer diameter/height/thickness (mm) | Outer diameter 450/height 400/thickness 10 | Outer diameter 450/height 400/thickness 10 |
| | Color tone | Outside: white opaque<br>Inside: transparent | Outside: white opaque<br>Inside: transparent |
| | OH group concentration (ppm by weight) | 50 | 60 |
| | Alkaline metal concentration (ppm by weight) | Li: 1, Na: 5, K: 1 | Li: 1, Na: 5, K: 1 |
| | Light transmittance (%) at wavelength of 600 nm (Inner peripheral part) | 91.6 | 91.6 |
| Physical properties of inner layer | Thickness (mm) | 5 | 5 |
| | Color tone | Colorless and transparent | Colorless and transparent |
| | OH group concentration (ppm by weight) | 30 | 40 |
| | Al Concentration (ppm by weight) | 3 | 3 |
| | Alkaline earth metal concentration (ppm by weight) | Ba: 180 | Ba: 180 |
| | Alkaline metal concentration (ppb by weight) | Li: 1, Na: 2, K: 1 | Li: 1, Na: 4, K: 2 |
| | Release amount of water molecules (molecules/g) | $<1 \times 10^{17}$ | $<1 \times 10^{17}$ |
| | Light transmittance (%) at wavelength of 600 nm | 91.6 | 91.5 |
| Evaluation | Single crystal multipulling | Fair | Fair |
| | Void/pinhole of single crystal | Fair | Poor |
| | Container etching resistance | Fair | Fair |
| | Expansion of container gaseous bubbles | Poor | Fair |
| | Production cost of container | Fair | Fair |

As can be seen in Tables 1 to 8, in Examples 1 to 10 that are in accord with the method for producing a silica container of the present invention, the silica containers giving the results in pulling up of a single crystal no way inferior to conventional silica containers of Comparative Examples 1 and 2 could be obtained, in spite of the silica containers produced with a low cost and a higher productivity. In addition, the etching resistance to a silicon melt could be remarkably improved as compared with a conventional silica container of Comparative Example 2.

It was found that less numbers of voids and pinholes were formed in a silicon single crystal produced by using a silica container of Examples 1 to 10 as compared with Comparative Examples 1 to 6.

It must be noted here that the present invention is not limited to the embodiments as described above. The foregoing embodiments are mere examples; any form having substantially the same composition as the technical concept described in claims of the present invention and showing similar effects is included in the technical scope of the present invention.

The invention claimed is:

1. A silica container comprising:
a substrate, having a rotational symmetry, comprised of mainly a silica, containing gaseous bubbles in a peripheral part of the substrate;
a first transparent silica glass in an inner peripheral part of the substrate; and
an inner layer, formed on an inner surface of the substrate and comprising a second transparent silica glass;
wherein:
the substrate contains Li, Na, and K in a total concentration of 50 or less ppm by weight,
the substrate has a linear light transmittance of 91.8% to 93.2% at a light wavelength of 600 nm for a sample having 10 mm thickness cut-out from the inner peripheral part and finished with both surfaces being parallel and optically polished,
the inner layer contains Li, Na, and K in a total concentration of 100 or less ppb by weight and at least one of Ca, Sr, and Ba in a total concentration of 50 to 2000 ppm by weight, and
the inner layer has a linear light transmittance of 91.8% to 93.2% at a light wavelength of 600 nm for a sample having 10 mm thickness cut-out from the inner layer and finished with both surfaces being parallel and optically polished, and an amount of water molecules released from a sample cut-out from the inner layer upon heating under vacuum at 1000° C. is less than $2 \times 10^{17}$ molecules/g.

2. The silica container according to claim 1, wherein the inner layer comprises:
Ba in a concentration of 100 to 1000 ppm by weight; and
Al in a concentration of 10 to 100 ppm by weight.

3. The silica container according to claim 1, wherein the inner layer comprises:
OH groups in a concentration of 1 to 50 ppm by weight;
Li, Na, and K each in a concentration of 20 or less ppb by weight; and
Ti, Cr, Mn, Fe, Ni, Cu, Zn, Zr, Mo, and W each in a concentration of 10 or less ppb by weight.

4. The silica container according to claim 2, wherein the inner layer comprises:
OH groups in a concentration of 1 to 50 ppm by weight;
Li, Na, and K each in a concentration of 20 or less ppb by weight; and
Ti, Cr, Mn, Fe, Ni, Cu, Zn, Zr, Mo, and W each in a concentration of 10 or less ppb by weight.

* * * * *